(12) United States Patent
Asadi et al.

(10) Patent No.: US 11,853,590 B2
(45) Date of Patent: Dec. 26, 2023

(54) READ THRESHOLD ESTIMATION SYSTEM USING CALCULATIONS BASED ON POLYNOMIAL REGRESSION

(71) Applicant: SK hynix Inc., Gyeonggi-do (KR)

(72) Inventors: Meysam Asadi, Fremont, CA (US); Teodor Vlasov, Minsk (BY); Fan Zhang, Fremont, CA (US); Aman Bhatia, Los Gatos, CA (US)

(73) Assignee: SK hynix Inc., Gyeonggi-do (KR)

( * ) Notice: Subject to any disclaimer, the term of this patent is extended or adjusted under 35 U.S.C. 154(b) by 155 days.

(21) Appl. No.: 17/541,039

(22) Filed: Dec. 2, 2021

(65) Prior Publication Data

US 2023/0176768 A1 Jun. 8, 2023

(51) Int. Cl.
*G06F 12/00* (2006.01)
*G06F 3/06* (2006.01)
*G11C 11/56* (2006.01)
*G11C 16/26* (2006.01)
*G11C 16/04* (2006.01)

(52) U.S. Cl.
CPC .......... *G06F 3/0655* (2013.01); *G06F 3/0604* (2013.01); *G06F 3/0679* (2013.01); *G11C 11/5642* (2013.01); *G11C 11/5671* (2013.01); *G11C 16/0483* (2013.01); *G11C 16/26* (2013.01)

(58) Field of Classification Search
CPC .... G06F 3/0655; G06F 3/0604; G06F 3/0679; G11C 11/5642; G11C 11/5671; G11C 16/0483; G11C 16/26
USPC ........................................................ 711/154
See application file for complete search history.

(56) References Cited

U.S. PATENT DOCUMENTS

| 9,111,626 | B2 * | 8/2015 | Kim .................... G11C 16/0483 |
| 11,128,636 | B1 | 9/2021 | Jorasch et al. |
| 2010/0091535 | A1 * | 4/2010 | Sommer ................ G11C 16/04 365/45 |
| 2021/0271675 | A1 | 9/2021 | Kornmeier et al. |

* cited by examiner

*Primary Examiner* — Mardochee Chery
(74) *Attorney, Agent, or Firm* — IP & T GROUP LLP

(57) ABSTRACT

A controller determines, for each read operation, a mathematical model by using a) a set function of a read threshold voltage set among the plurality of read threshold voltages and b) a set checksum value; determines a polynomial regression model based on the mathematical model; determines a parameter set by using multiple computations between input and output matrices based on the polynomial regression model; and estimates a next read threshold voltage for a next read operation based on the parameter set. The controller computes mathematical operation algorithms to replace a normal multiplication operation, a normal division operation and a normal multiplication followed by division operation.

20 Claims, 12 Drawing Sheets

READ THRESHOLD ESTIMATION SYSTEM USING CALCULATIONS BASED ON POLYNOMIAL REGRESSION

BACKGROUND

1. Field

Embodiments of the present disclosure relate to a scheme for adaptively determining a read threshold voltage in a memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since the memory devices have no moving parts. Examples of memory systems having such advantages include universal serial bus (USB) memory devices, memory cards having various interfaces such as a universal flash storage (UFS), and solid state drives (SSDs). Memory systems may determine an optimal read threshold voltage among read threshold voltages according to various schemes.

SUMMARY

Aspects of the present invention include a system and a method for adaptively estimating a read threshold voltage using calculations based on polynomial regression for previous reads.

In one aspect, a memory system includes a memory device including a plurality of pages and a controller. The controller performs read operations on a select page among the plurality of pages using a plurality of read threshold voltages; determines, for each read operation, a mathematical model by using a) a set function of a read threshold voltage set among the plurality of read threshold voltages and b) a set checksum value; determines a polynomial regression model based on the mathematical model; determine a parameter set by using multiple computations between input and output matrices based on the polynomial regression model; and estimates a next read threshold voltage for a next read operation based on the parameter set. The input matrix includes entries of read threshold voltage sets from the read operations and the output matrix includes entries of check sum values for the read operations. The multiple computations correspond to a product between a first component and a second component, the first component being the inverse of a third component, the second component being a product between the transpose of the input matrix and the output matrix, the third component being a product between the transpose of the input matrix and the input matrix. Each component is calculated by a mathematical operation on two or more numbers as entries selected from one or more among the input and output matrices. The mathematical operation includes normalizing and scaling down the two or more numbers for multiplication, division and multiplication followed by division.

In another aspect, a method operates a memory device including a plurality of pages and a controller. The method includes: performing read operations on a select page among the plurality of pages using a plurality of read threshold voltages; determining, for each read operation, a mathematical model by using a) a set function of a read threshold voltage set among the plurality of read threshold voltages and b) a set checksum value; determining a polynomial regression model based on the mathematical model; determining a parameter set by using multiple computations between input and output matrices based on the polynomial regression model; and estimating a next read threshold voltage for a next read operation based on the parameter set. The input matrix includes entries of read threshold voltage sets from the read operations and the output matrix includes entries of check sum values for the read operations. The multiple computations correspond to a product between a first component and a second component, the first component being the inverse of a third component, the second component being a product between the transpose of the input matrix and the output matrix, the third component being a product between the transpose of the input matrix and the input matrix. Each component is calculated by a mathematical operation on two or more numbers as entries selected from one or more among the input and output matrices. The mathematical operation includes normalizing and scaling down the two or more numbers for multiplication, division and multiplication followed by division.

Additional aspects of the present invention will become apparent from the following description.

DETAILED DESCRIPTION

Figure 1:
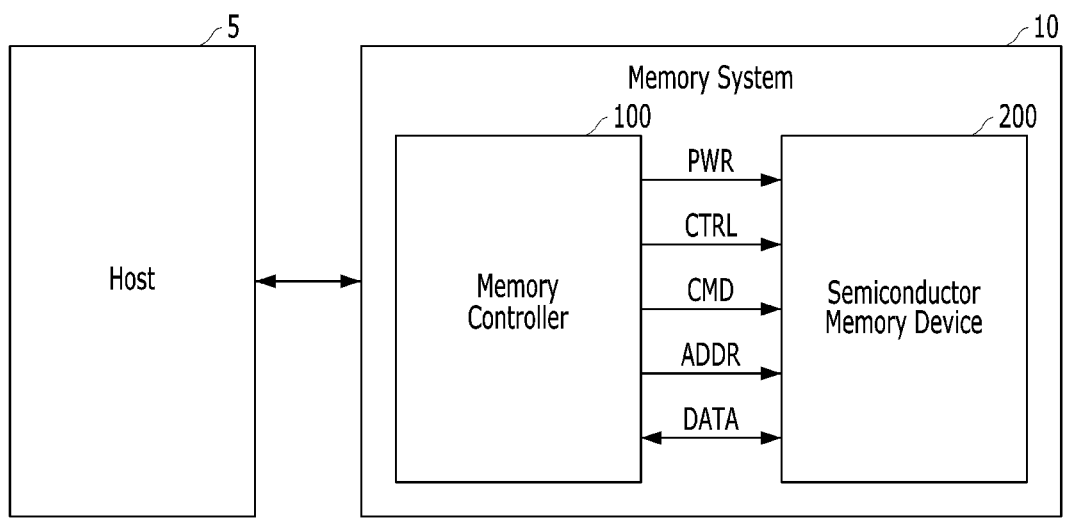
FIG. 1 is a block diagram illustrating a data processing system.

Various embodiments of the present invention are described below in more detail with reference to the accompanying drawings. The present invention may, however, be embodied in different forms and thus should not be construed as limited to the embodiments set forth herein. Rather, these embodiments are provided so that this disclosure conveys the scope of the present invention to those skilled in the art. Moreover, reference herein to "an embodiment," "another embodiment," or the like is not necessarily to only one embodiment, and different references to any such phrase are not necessarily to the same embodiment(s). The term "embodiments" as used herein does not necessarily refer to all embodiments. Throughout the disclosure, like reference numerals refer to like parts in the figures and embodiments of the present invention.

The present invention can be implemented in numerous ways, for example including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the present invention may take, may be referred to as techniques. In general, the order of the operations of disclosed processes may be altered within the scope of the present invention. Unless stated otherwise, a component such as a processor or a memory described as being suitable for performing a task may be implemented as a general device or circuit component that is configured or otherwise programmed to perform the task at a given time or as a specific device or as a circuit component that is manufactured or pre-configured or pre-programmed to perform the task. As used herein, the term 'processor' or the like refers to one or more devices, circuits, and/or processing cores suitable for processing data, such as computer program instructions.

The methods, processes, and/or operations described herein may be performed by code or instructions to be executed for example by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described herein, the code or instructions for implementing the operations of the method embodiments may transform the computer, processor, controller, or other signal processing device into a special-purpose processor for performing any one of the methods herein.

If implemented at least partially in software, the controllers, processors, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device.

A detailed description of various embodiments of the present invention is provided below along with accompanying figures that illustrate aspects of the present invention. The present invention is described in connection with such embodiments, but the present invention is not limited to any specific embodiment. The present invention encompasses numerous alternatives, modifications and equivalents. Numerous specific details are set forth in the following description in order to provide a thorough understanding of the present invention. These details are provided for the purpose of example; the present invention may be practiced without some or all of these specific details. For clarity, technical material that is known in technical fields related to the present invention has not been described in detail so that the invention is not unnecessarily obscured.

FIG. 1 is a block diagram illustrating a data processing system 2 in accordance with one embodiment of the present invention.

Referring FIG. 1, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any of various types of electronic devices. In various embodiments, the host device 5 may be an electronic device such as for example a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may be a portable electronic device such as for example a mobile phone, a smart phone, an e-book, an MP3 player, a portable multimedia player (PMP), and/or a portable game player.

The memory system 10 may be implemented with any of various types of storage devices such as a solid state drive (SSD) and a memory card. In various embodiments, the memory system 10 may be provided as one of various components in an electronic device such as for example a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operations of the semiconductor memory device 200.

The semiconductor memory device 200 may perform one or more erase, program, and read operations under the control of the memory controller 100. The semiconductor memory device 200 may receive through input/output lines a command CMD, an address ADDR and data DATA. The semiconductor memory device 200 may receive power PWR through a power line and a control signal CTRL through a control line. The control signal CTRL may include for example a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. In one embodiment of the invention, where the semiconductor memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Figure 2:
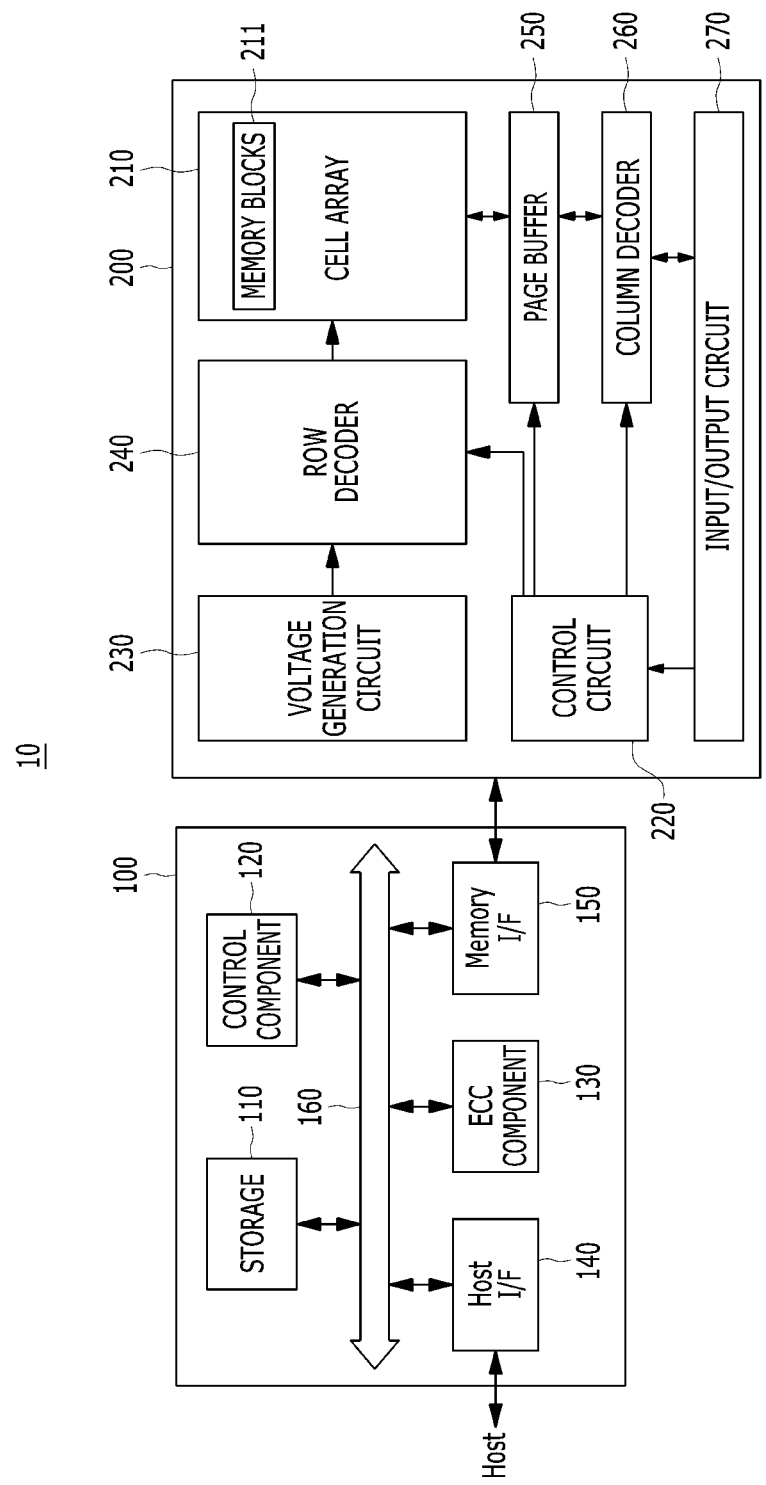
FIG. 2 is a block diagram illustrating a memory system.

FIG. 2 is a block diagram illustrating a memory system in accordance with one embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device (e.g., a request from host device 5 of FIG. 1), and in particular, store data to be accessed by the host device.

The memory device 200 may store data to be accessed by the host device.

The memory device 200 may be implemented with a volatile memory device such as for example a dynamic random access memory (DRAM) and/or a static random access memory (SRAM) or a non-volatile memory device such as for example a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as for example a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and storage 110 may store data for driving the memory system 10 and the controller 100. For example, when the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware or other program instructions, which can be referred to as a flash translation layer (FTL), to control operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. In one embodiment, the ECC component 130 may not correct error bits when the number of the error bits is greater than or equal to a threshold number of correctable error bits, but instead may output an error correction fail signal indicating failure in correcting the error bits.

In various embodiments, the ECC component 130 may perform an error correction operation based on a coded modulation such as for example a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices suitable for error correction operation.

The host interface 140 may communicate with the host device through one or more of various communication standards or interfaces such as for example a universal serial bus (USB), a multimedia card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. In one embodiment where the memory device 200 is a flash memory such as a NAND flash memory, the memory interface 150 may generate control signals for the memory and process data under the control of the control component 120.

The memory device 200 as shown for example in FIG. 2 may include a memory cell array 210, a control circuit 220, a voltage generation circuit 230, a row decoder 240, a page buffer 250, which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform program, read, or erase operations of the memory cell array 210. The control circuit 220 may control the peripheral circuit.

The voltage generation circuit 230 may generate operational voltages of various levels. For example, in an erase operation, the voltage generation circuit 230 may generate operational voltages of various levels such as for example an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
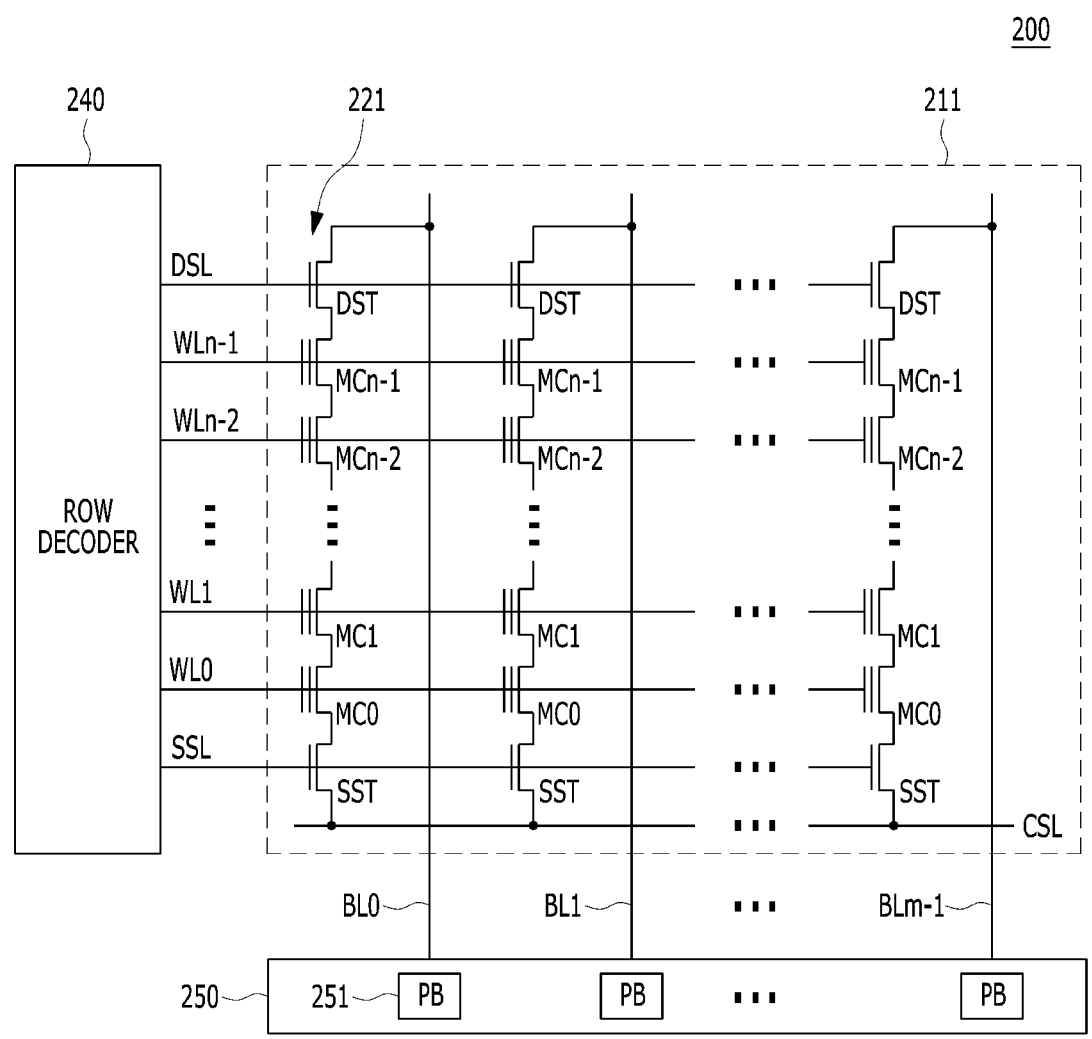
FIG. 3 is a circuit diagram illustrating a memory block of a memory device.

The page buffer 250 may be coupled with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or may transmit and receive data to and from the input/output circuit 270.

The input/output circuit 270 may transmit to the control circuit 220 a command and an address, received from an external device (e.g., the memory controller 100 of FIG. 1), transmit data from the external device to the column decoder 260, or output data from the column decoder 260 to the external device.

The control circuit 220 may control the peripheral circuit in response to the command and the address.

FIG. 3 is a circuit diagram illustrating a memory block of a semiconductor memory device in accordance with one embodiment of the present invention. For example, the memory block of FIG. 3 may be any of the memory blocks 211 of the memory cell array 210 shown in FIG. 2.

Referring to FIG. 3, the memory block 211 may include a plurality of word lines WL0 to WLn−1, a drain select line DSL and a source select line SSL coupled to the row decoder 240. These lines may be arranged in parallel, with the plurality of word lines between the DSL and SSL.

The memory block 211 may further include a plurality of cell strings 221 respectively coupled to bit lines BL0 to BLm−1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn−1 may be serially coupled between the selection transistors DST and SST. Each of the memory cells may be formed as a multiple level cell. For example, each of the memory cells may be formed as a single level cell (SLC) storing 1 bit of data. Each of the memory cells may be formed as a multi-level cell (MLC) storing 2 bits of data. Each of the memory cells may be formed as a triple-level cell (TLC) storing 3 bits of data. Each of the memory cells may be formed as a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm−1. The page buffers 251 may operate in response to page buffer control signals. For example, the page buffers 251 my temporarily store data received through the bit lines BL0 to BLm−1 or sense voltages or currents of the bit lines during a read or verify operation.

In various embodiments of the present invention, the memory blocks 211 may include a NAND-type flash memory cell. However, the memory blocks 211 are not limited to such cell type, and may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
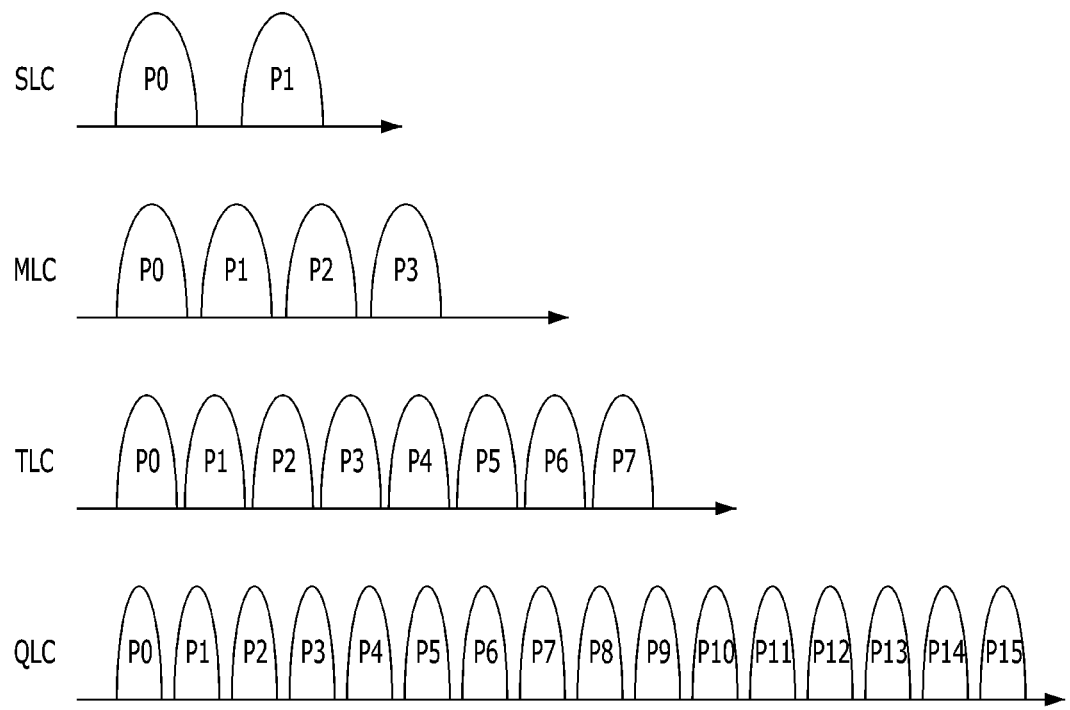
FIG. 4 is a diagram illustrating distributions of states for different types of cells of a memory device.

FIG. 4 is a diagram illustrating distributions of states or program voltage (PV) levels for different types of cells of a memory device.

Referring to FIG. 4, each of memory cells may be implemented with a specific type of cell, for example, a single level cell (SLC) storing 1 bit of data, a multi-level cell (MLC) storing 2 bits of data, a triple-level cell (TLC) storing 3 bits of data, or a quadruple-level cell (QLC) storing 4 bits of data. Usually, all memory cells in a particular memory device are of the same type, but that is not a requirement.

An SLC may include two states P0 and P1. P0 may indicate an erase state, and P1 may indicate a program state. Since the SLC can be set in one of two different states, each SLC may program or store 1 bit according to a set coding method. An MLC may include four states P0, P1, P2 and P3. Among these states, P0 may indicate an erase state, and P1 to P3 may indicate program states. Since the MLC can be set in one of four different states, each MLC may program or store two bits according to a set coding method. A TLC may include eight states P0 to P7. Among these states, P0 may indicate an erase state, and P1 to P7 may indicate program states. Since the TLC can be set in one of eight different states, each TLC may program or store three bits according to a set coding method. A QLC may include 16 states P0 to P15. Among these states, P0 may indicate an erase state, and P1 to P15 may indicate program states. Since the QLC can be set in one of sixteen different states, each QLC may program or store four bits according to a set coding method.

Referring back to FIGS. 2 and 3, the memory device 200 may include a plurality of memory cells (e.g., NAND flash memory cells). The memory cells are arranged in an array of rows and columns as shown in FIG. 3. The cells in each row are connected to a word line (e.g., WL0), while the cells in each column are coupled to a bit line (e.g., BL0). These word and bit lines are used for read and write operations. During a write operation, the data to be written ('1' or '0') is provided at the bit line while the word line is addressed. During a read operation, the word line is again addressed, and the threshold voltage of each cell can then be acquired from the bit line. Multiple pages may share the memory cells that belong to (i.e., are coupled to) the same word line. When the memory cells are implemented with MLCs, the multiple pages include a most significant bit (MSB) page and a least significant bit (LSB) page. When the memory cells are implemented with TLCs, the multiple pages include an MSB page, a center significant bit (CSB) page and an LSB page. When the memory cells are implemented with QLCs, the multiple pages include an MSB page, a center most significant bit (CMSB) page, a center least significant bit (CLSB) page and an LSB page. The memory cells may be programmed for example using a coding scheme (e.g., Gray coding) in order to increase the capacity of the memory system 10 such as SSD.

Figure 5A:
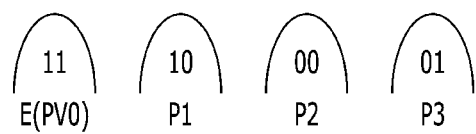
FIG. 5A is a diagram illustrating an example of Gray coding for a multi-level cell (MLC).

FIG. 5A is a diagram illustrating an example of coding for a multi-level cell (MLC).

Referring to FIG. 5A, an MLC may be programmed using a set type of coding. An MLC may have 4 program states, which include an erased state E (or PV0) and a first program state PV1 to a third program state PV3. The erased state E (or PV0) may correspond to "11." The first program state PV1 may correspond to "10." The second program state PV2 may correspond to "00." The third program state PV3 may correspond to "01."

Figure 5B:
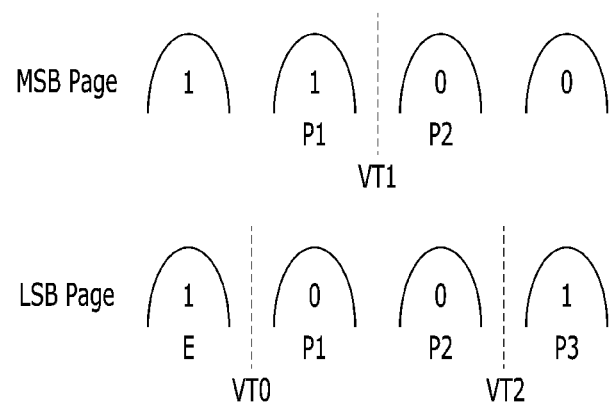
FIG. 5B is a diagram illustrating state distributions for pages of a multi-level cell (MLC).

In the MLC, as shown in FIG. 5B, there are 2 types of pages including LSB and MSB pages. 1 or 2 thresholds may be applied in order to retrieve data from the MLC. For an MSB page, the single threshold value is VT1. VT1 distinguishes between the first program state PV1 and the second program state PV2. For an LSB page, 2 thresholds include a threshold value VT0 and a threshold value VT2. VT0 distinguishes between the erased state E and the first program state PV1. VT2 distinguishes between the second program state PV2 and the third program state PV3.

Figure 6A:
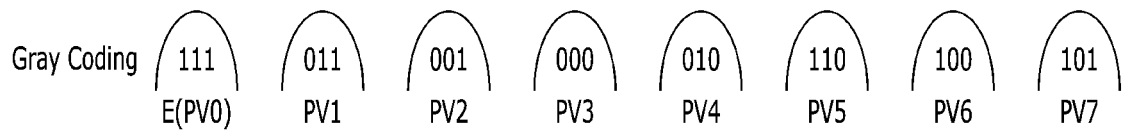
FIG. 6A is a diagram illustrating one example of Gray coding for a triple-level cell (TLC).

FIG. 6A is a diagram illustrating an example of Gray coding for a triple-level cell (TLC).

Referring to FIG. 6A, a TLC may be programmed using Gray coding. A TLC may have 8 program states, which include an erased state E (or PV0) and a first program state PV1 to a seventh program state PV7. The erased state E (or PV0) may correspond to "111." The first program state PV1 may correspond to "011." The second program state PV2 may correspond to "001." The third program state PV3 may correspond to "000." The fourth program state PV4 may correspond to "010." The fifth program state PV5 may correspond to "110." The sixth program state PV6 may correspond to "100." The seventh program state PV7 may correspond to "101."

Figure 6B:
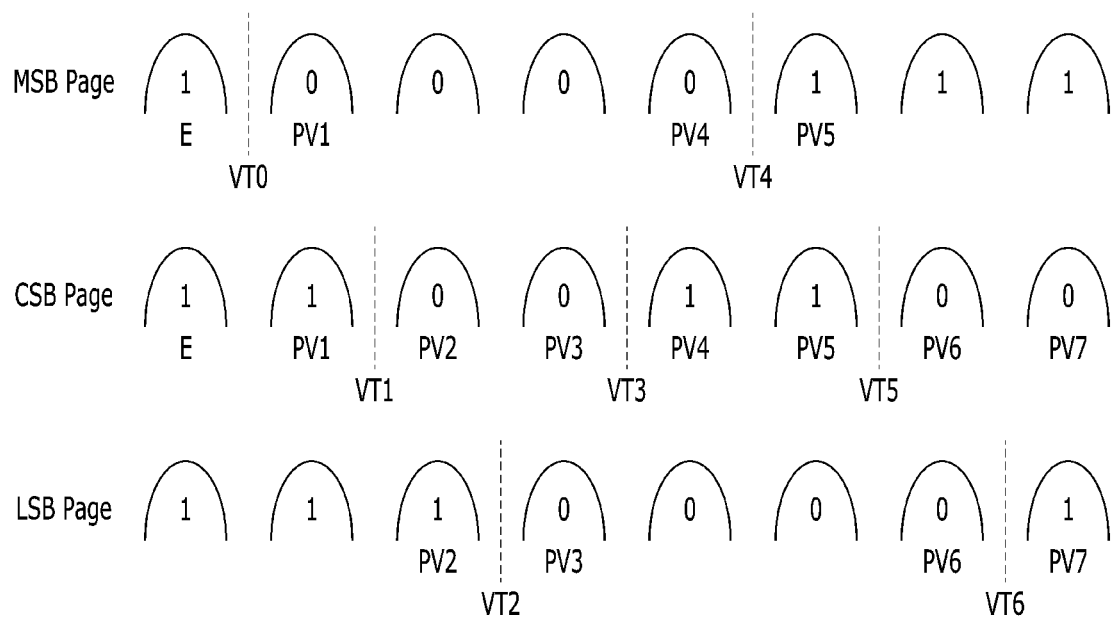
FIG. 6B is a diagram illustrating state distributions for pages of a triple-level cell (TLC).

In the TLC, as shown in FIG. 6B, there are 3 types of pages including LSB, CSB and MSB pages. 2 or 3 thresholds may be applied in order to retrieve data from the TLC. For an MSB page, 2 thresholds include a threshold value VT0 that distinguishes between an erase state E and a first program state PV1 and a threshold value VT4 that distinguishes between a fourth program state PV4 and a fifth program state PV5. For a CSB page, 3 thresholds include VT1, VT3 and VT5. VT1 distinguishes between a first program state PV1 and a second program state PV2. VT3 distinguishes between a third program state PV3 and the fourth program state PV4. VT5 distinguishes between the fourth program state PV5 and the sixth program state PV6. For an LSB page, 2 thresholds include VT2 and VT6. VT2 distinguishes between the second program state PV2 and the third program state PV3. VT6 distinguishes between the sixth program state PV6 and a seventh program state PV7.

After a memory array including a plurality of memory cells is programmed as described in FIGS. 5A and 6A, when a read operation is performed on the memory array using a reference voltage such as a read threshold voltage (also called "read voltage level" or "read threshold"), the electrical charge levels of the memory cells (e.g., threshold voltage levels of transistors of memory cells) are compared to one or more reference voltages to determine the state of individual memory cells. When a specific read threshold is applied to the memory array, those memory cells that have threshold voltage levels higher than the reference voltage are turned on and detected as "on" cell, whereas those memory cells that have threshold voltage levels lower than the reference voltage are turned off and detected as "off" cell, for example. Therefore, each read threshold is arranged between neighboring threshold voltage distribution windows corresponding to different programmed states so that each read threshold can distinguish such programmed states by turning on or off the memory cell transistors.

When a read operation is performed on memory cells in a data storage device using MLC technology, the threshold voltage levels of the memory cells are compared to more than one read threshold level to determine the state of individual memory cells. Read errors can be caused by distorted or overlapped threshold voltage distributions. An ideal memory cell threshold voltage distribution can be significantly distorted or overlapped due to, e.g., program and erase (P/E) cycles, cell-to-cell interference, and/or data retention errors. For example, as program/erase cycles increase, the margin between neighboring threshold voltage distributions of different programmed states decreases and eventually the distributions overlap. As a result, the memory cells with threshold voltages that fall within the overlapping region of the neighboring distributions may be read as being programmed to a value other than the original targeted value and thus cause read errors. Such read errors may be managed in many situations by using error correction codes (ECC). When the number of bit errors on a read operation exceeds the ECC correction capability of the data storage, the read operation using a set read threshold voltage fails. The set read threshold voltage may be a previously used read threshold voltage (i.e., a historical read threshold voltage). The historical read threshold voltage may be the read threshold voltage used in the last successful decoding, that is, a read voltage used in a read-passed read operation performed before read retry operations. When the read operation using the set read threshold voltage failed, the controller 120 may control an error recovery algorithm such as for example the algorithm shown in FIG. 7.

Figure 7:
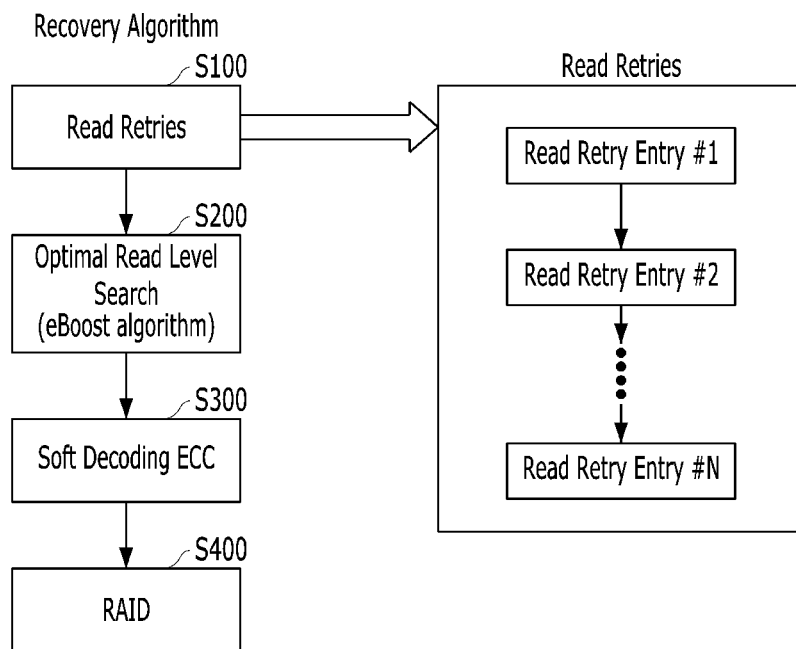
FIG. 7 is a diagram illustrating a flow of an error recovery algorithm in a memory system.

Referring to FIG. 7, the controller 120 may perform one or more read retry operations for the memory cells using one or more read threshold voltages applied in a set order (S100). For example, the read threshold voltages may include N (e.g., N is 5 or 10) read threshold voltages (or read voltage levels) including a first read threshold voltage to an Nth read threshold voltage. The first read threshold voltage may be a previously used read threshold voltage (i.e., history read threshold voltage). The historical read threshold voltage may be the read threshold voltage used in the last successful decoding, that is, a read voltage used in a read-passed read operation performed before the read retry operations. The controller 120 may perform the read retry operations until it is determined that decoding associated with a corresponding read retry operation is successful.

When all read retry operations using the read threshold voltages have failed, the controller 120 may perform additional recovery operations. For example, the additional recovery operations may include an optimal read threshold voltage search (S200), a soft decoding using an error correction code (ECC) (S300) and/or a redundant array of independent disks (RAID) recovery (S400).

As noted above, data retrieved from a memory device (e.g., a NAND flash device) in a data storage device (e.g., a solid state drive (SSD)) usually contains many bit errors due to various noise sources. To protect the data, it is encoded by an error correction code before being written to the memory device (i.e., before being written to a storage medium). A decoder may correct all bit errors by using this error correction code. As illustrated in FIG. 7 by the "Read Retries" shown there, in one embodiment of the present invention, when the number of errors surpasses the capability of the error correction code, the data storage device may invoke a particular defense algorithm (e.g., a read retry operation) to read the storage media multiple times with better parameters than the original read operation until the data can be recovered by the error correction code. As detailed below, different read thresholds can be used to better read pages of data.

For a solid state drive, one source of increased bit errors is the use of sub-optimal read thresholds during the read operation. One method (e.g., an eBoost algorithm) to estimate an optimal read threshold performs several additional read operations with different read thresholds on the same page, and estimates the optimal read threshold that minimizes the bit errors in the retrieved data. These additional read operations increase the latency of the read operation and degrades a quality of service (QoS) of the data storage device (or memory system). Accordingly, embodiments of the present invention provide a scheme to estimate an optimal read threshold without necessarily performing additional read operations.

Figure 8:
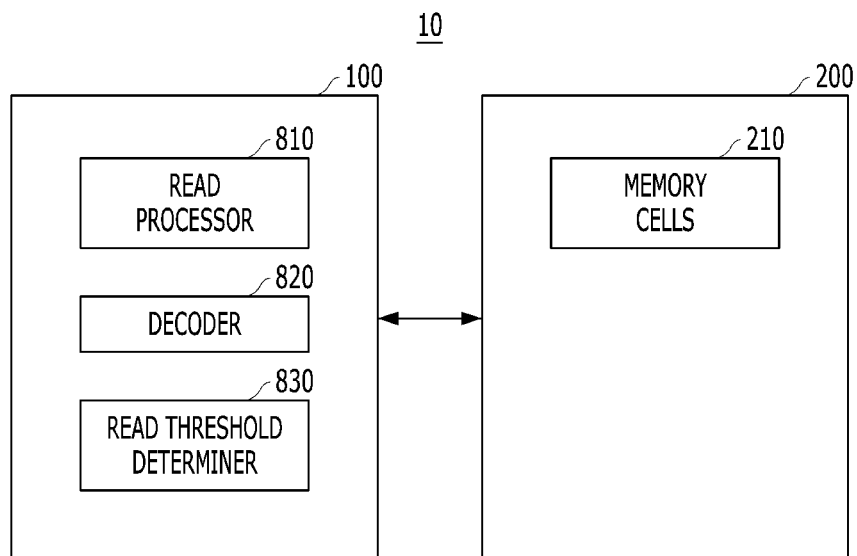
FIG. 8 is a diagram illustrating a memory system in accordance with one embodiment of the present invention.

FIG. 8 is a diagram illustrating a memory system 10 in accordance with one embodiment of the present invention.

Referring to FIG. 8, the memory system 10 may include a controller 100 and a memory device 200. The memory device 200 may include a plurality of memory cells (e.g., NAND flash memory cells) 210. The memory cells are arranged in an array of rows and columns such as shown in FIG. 3. The cells in each row are connected to a word line (e.g., WL0), while the cells in each column are coupled to a bit line (e.g., BL0). These word and bit lines are used for read and write operations. During a write operation, the data to be written ('1' or '0') is provided at the bit line while the word line is addressed. During a read operation, the word line is again addressed, and the threshold voltage of each cell can then be acquired from the bit line. Multiple pages may share the memory cells that belong to (i.e., are coupled to) the same word line. When the memory cells are implemented with MLCs, the multiple pages include a most significant bit (MSB) page and a least significant bit (LSB) page. When the memory cells are implemented with TLCs, the multiple pages include an MSB page, a center significant bit (CSB) page and an LSB page. When the memory cells are implemented with QLCs, the multiple pages include an MSB page, a center most significant bit (CMSB) page, a center least significant bit (CLSB) page and an LSB page. The memory cells may be programmed using a coding scheme (e.g., Gray coding) in order to increase the capacity of the memory system 10 such as an SSD.

The controller 100 may include a read processor 810, a decoder 820 and an optimal read threshold determiner 830. Although it is illustrated that components of the controller 100 are implemented separately, these components may be implemented with an internal component (i.e., firmware (FW)) of the control component 120 in FIG. 2. The controller 100 and the memory device 200 may include various other components such as those shown in FIG. 2.

The read processor 810 may control one or more read operations for the memory device 200 in response to a read request from a host (e.g., the host 5 of FIG. 1). The read processor 810 may control the read operations using various read thresholds. The decoder 820 may decode data associated with the read operations.

In various embodiments of the present invention, the read processor 810 may control a read operation for the memory cells using a select read threshold from a set read level table. In various embodiments, the read level table may include multiple read thresholds and the select read threshold may include a default read threshold. When the read operation is performed for the MSB page of TLC, the select read threshold may include a pair of first and second read thresholds [VT0, VT4] as shown in FIG. 6B. The first read threshold value VT0 is used to distinguish between an erase state (i.e., E) and a first program state (i.e., PV1), and the second read threshold value VT4 is used to distinguish between a fourth program state (i.e., PV4) and a fifth program state (i.e., PV5). When the read operation is performed for the LSB page of TLC, the select read threshold may include a pair of first and second read thresholds [VT2, VT6] such as shown in FIG. 6B. The first read threshold value VT2 is used to distinguish between a second program state (i.e., PV2) and a third program state (i.e., PV3), and the second read threshold value VT6 is used to distinguish between a sixth program state (i.e., PV6) and a seventh program state (i.e., PV7).

In one embodiment of the present invention, it is determined whether the read operation using a read threshold selected from a read threshold set succeeded or failed, depending on the decoding result of the decoder 820. When the read operation using the selected read threshold(s) failed, the read processor 810 may control one or more read retry operations for the memory cells using read retry entries, such as shown in FIG. 7.

The optimal read threshold determiner 830 may provide a scheme of an optimal read threshold voltage (Vt) estimation (or prediction). In various implementations, the optimal read threshold determiner 830 may estimate a read threshold voltage Vt through P1 estimation and CS estimation. Implementations of the read threshold determiner 830 are described in U.S. patent application Ser. No. 17/103,513, filed on Nov. 24, 2020, entitled "SYSTEMS FOR ADAPTIVELY DETERMINING READ THRESHOLD VOLTAGE USING META INFORMATION" and U.S. patent application Ser. No. 17/348,391, filed on Jun. 15, 2021, entitled "PARAMETER ESTIMATION BASED ON PREVIOUS READ ATTEMPTS IN MEMORY DEVICES," which are all incorporated by reference herein in their entirety. One implementation of U.S. patent application Ser. No. 17/103,513 is described with reference to FIGS. 8 to 11.

In FIG. 8, for P1 estimation, the read threshold determiner 830 may obtain meta information associated with previous read operations performed on a select page among the plurality of pages, the meta information including, for a given read operation, multiple read threshold voltages previously used, i.e., (a read threshold voltage set), a checksum value and percentage of bits of a particular value, i.e., 0's or 1's, in data associated with the read operation. The read threshold determiner 830 may determine a mathematical model (e.g., a quadratic model shown in Equation (1) or (7)) for estimating a percentage of bits of the particular value in data associated with a next read operation, by using at least a set function of the read threshold voltage set used for a current read operation. As used herein, a "set function" refers to a function that operates on a set of numbers such as denoted below in one example as S(•) of a read threshold voltage set (e.g., $(v_2, v_6)$) and as set forth in Equations (1) and (7)). The read threshold determiner 830 may determine a set of parameters for performing read operations by performing linear regression on the mathematical model. The read threshold determiner 830 may determine a best previous read threshold voltage set among multiple read threshold voltage sets for multiple past reads, based on the multiple checksum values. For example, the best previous read threshold voltage may be the read threshold voltage having the lowest checksum. The read threshold determiner 830 may determine a point corresponding to the best pervious read threshold voltage set on a surface defined by the voltages of that set. In various embodiments, a surface for LSB page of TLC may be formed by a set [VT2, VT6] of the multiple read threshold voltage sets (e.g., VT0 to VT7). The read threshold determiner 830 may determine a line on the surface pointing to a next read threshold voltage for the next read operation based on the set of parameters.

For CS estimation, the read threshold determiner 830 may obtain meta information associated with a read operation on a select page among the plurality of pages, the meta information including a read threshold voltage set which is associated with previous read operations. The read threshold determiner 830 may determine a mathematical model for estimating a checksum value of data associated with a next read operation, by using a set function of the read threshold voltage set and a maximum possible checksum value (e.g., a target checksum value). The read threshold determiner 830 may determine a set of parameters to determine a set of optimal read threshold voltages to be used for a next read operation by performing polynomial regression on the mathematical model. The read threshold determiner 830 may estimate a next read threshold voltage for the next read operation based on the set of parameters.

Further, the read threshold determiner 830 may determine whether estimated read threshold voltages are valid. In some embodiments, the read threshold determiner 830 may determine whether estimated next read threshold voltages are within a set threshold range.

When it is determined that at least one of the estimated read threshold voltages is valid (Pass), the read threshold determiner 830 may determine all of the estimated read threshold voltages, or only the estimated read threshold voltage determined to be valid, as a new read threshold voltage $V^{(n)}$ for a next read operation.

When it is determined that all of the estimated read threshold voltages are invalid (Fail), the read threshold determiner 830 may perform an exploratory read to estimate a new read threshold voltage $V^{(n)}$ for a next read operation. In various embodiments, the read threshold determiner 830 may divide the set threshold range into multiple zones when it is determined that none of the estimated read threshold voltages are within the set threshold range. The read threshold determiner 830 may find a zone with the lowest number of previous read threshold voltages, among the multiple zones. The read threshold determiner 830 may randomly determine, as the new read threshold voltage $V^{(n)}$, any read threshold voltage in the zone.

Figure 9:
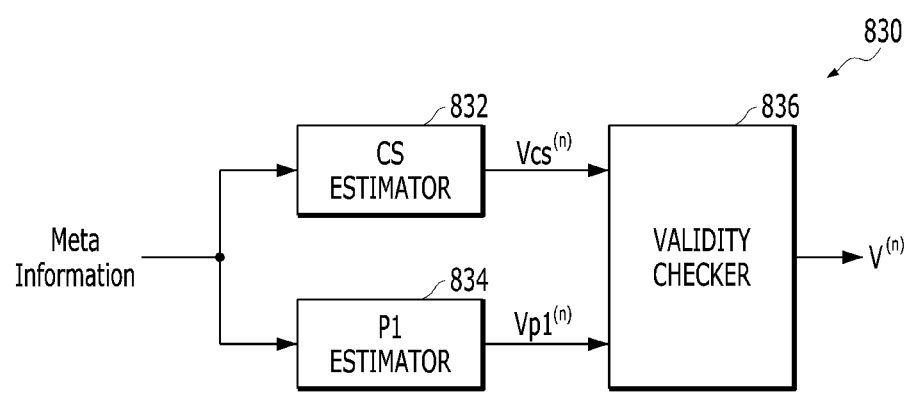
FIG. 9 is a diagram illustrating a read threshold determiner in accordance with another embodiment of the present invention.

FIG. 9 is a diagram illustrating a read threshold determiner 830 in accordance with another embodiment of the present invention.

Referring to FIG. 9, for the adaptive RR scheme, the read threshold determiner 830 may use and process meta information to determine and output a read threshold voltage $V^{(n)}$ for a next read operation. In some embodiments, the meta information may be collected from the decoder 820 even when reads are not successful, i.e., read data not successfully decoded. The meta information for CS estimation and P1 estimation, as described above, may be used. The meta information is input to each of a CS estimator 832 and a P1 estimator 834. For an LSB page of TLC memory cells, the meta information includes read threshold voltages ($v_2$, $v_6$) or (VT2, VT6) in FIG. 6B, and percentage of 1's (i.e., $P_1$) in read data or the decoding result of the read data. For a page written with randomized data, $P_1$ is close to 50%, and a checksum represents an initial syndrome weight of a codeword (e.g., a low density parity check (LDPC) codeword) corresponding to the decoding result of read data. Although features of the invention are described in the context of an LSB page of TLC memory cells, such features may be applied to any page of various memory cells, e.g., MSB or CSB pages of TLC memory cells, or MSB, CMSB, CLSB or LSB pages of QLC memory cells.

Figure 10A:
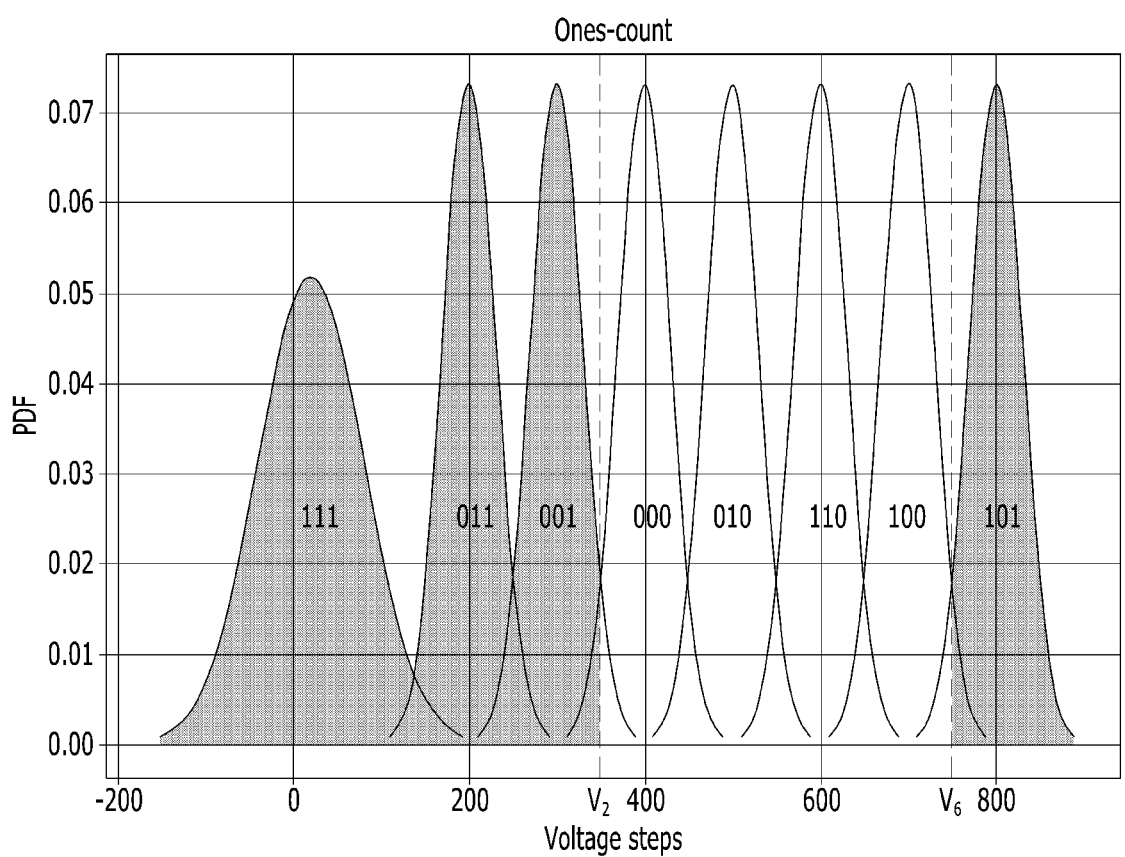
FIGS. 10A and 10B are diagrams illustrating meta information in accordance with still another embodiment of the present invention.
Figure 10B:
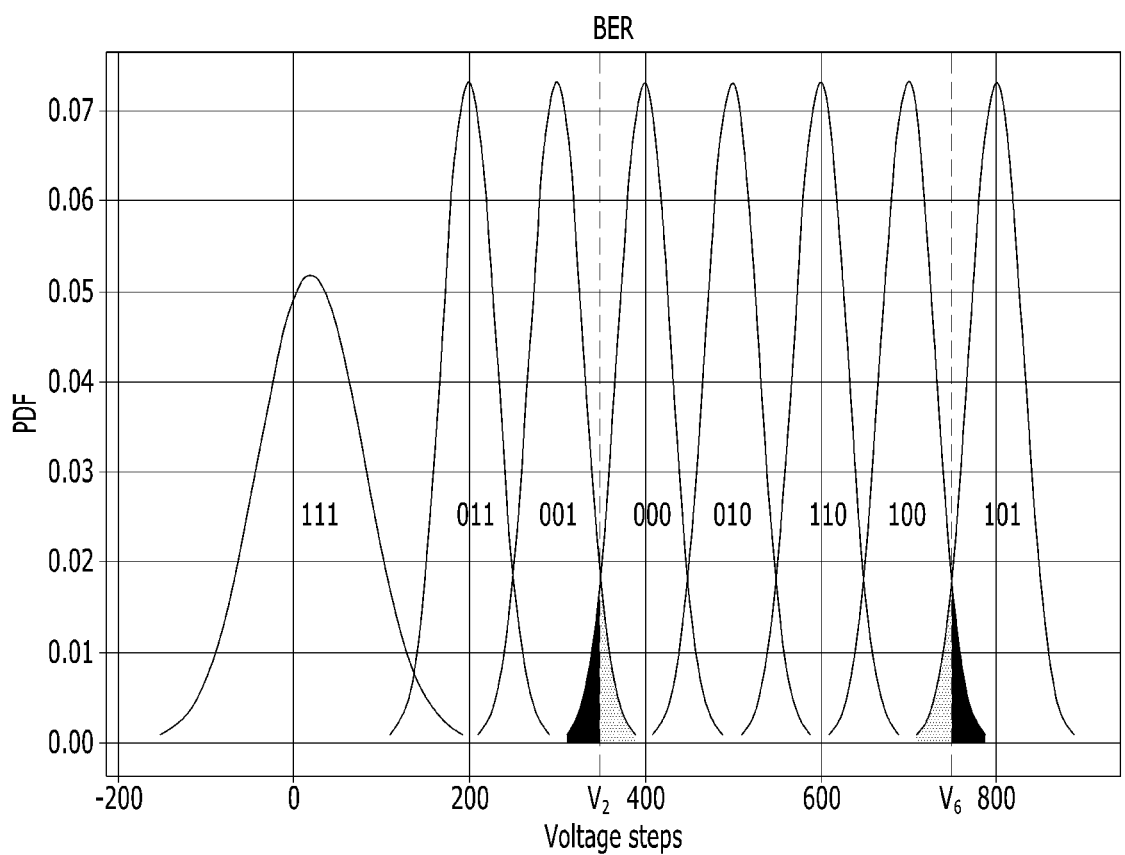

FIGS. 10A and 10B are diagrams illustrating meta information with respect to TLC memory cell-level distribution in accordance with one embodiment of the present invention. In FIGS. 10A and 10B, the horizontal axis (i.e., x-axis) represents read threshold voltages and the vertical axis (i.e., y-axis) represents a distribution, i.e., probability density function (PDF) for programmed TLC memory cells.

Referring to FIG. 10A, when an LSB page of TLC memory cells is programmed with randomized data, $P_1$ (percentage of 1's) is close to 50% in the shaded portions.

Ideally, if these distributions are disjoint, error-free data can be recovered by applying read thresholds. However, these distributions may be crossing or overlapped each other. In this case, by applying a read (e.g., V2 & V6 for LSB page), some information can be observed even if decoding is not successful. In FIG. 10A, shaded portions show the probability of observing a binary value of 1. The shaded portions in FIG. 10B show the probability of read failure. After each read, the number of cells that are read as a binary value of 1 can be found. However, the probability of the read failure cannot be observed. Instead, a checksum which is a mapping of the probability of the read failure can be determined.

Referring to FIG. 10B, checksum or syndrome weight of a codeword of the decoding result of read data may be used to estimate a bit error rate (BER), i.e., read failure.

Referring back to FIG. 9, the read threshold determiner 830 may receive meta information associated with previous failed read data as input. In some embodiments, the meta information may include information $V_r$ and $O_r$, which are collected from the read processor 810 and/or the decoder 820 in FIG. 8. $V_r = \{(v_2^{(k)}, v_6^{(k)}), 1 \leq k \leq m\}$ may be the set of previous failed read thresholds for the LSB page of TLC memory cells. $O_r = \{(c_s^{(k)}, p_1^{(k)}), 1 \leq k \leq m\}$ may be the set of observations CS, $P_1$, which are obtained from the decoder 820 after applying $V_r$ by the read processor 810. CS represents a checksum value and $P_1$ representing the percentage of 1's in decoded data.

The CS estimator 832 may estimate the checksum value $\widehat{CS}$ for a next potential read threshold voltage to be used for a next read operation. $\widehat{CS}$ means the estimated checksum (CS). Although the actual CS value may be obtained after each read operation, the CS estimator 832 may estimate a checksum value using a mathematical model. The CS estimator 832 may find $\widehat{CS}$ such that it is as close to the actual CS value as possible. In some embodiments, the CS estimator 832 may estimate the checksum value for the next potential read threshold voltage using a mathematical model (i.e., a quadratic model) as shown in Equation (1):

$$\widehat{CS} = CS_{max} \times S(\theta_0 + \theta_1 v_2 + \theta_2 v_2^2 + \theta_3 v_6 + \theta_4 v_6^2) \quad (1)$$

In Equation (1), S(•) denotes a set function such as for example a sigmoid function, $CS_{max}$ represents the largest possible checksum value, and $(v_2, v_6)$ represents the set of previous read thresholds for the LSB page of TLC memory cells. $CS_{max}$ may be the size of a syndrome or the number of rows in a parity check matrix, which are associated with decoding of read data. $\{\theta_0, \theta_1, \ldots, \theta_4\}$ may be a set of parameters to determine a set of optimal read threshold voltages to be used for a next read operation. In some embodiments, when the number of rows in the parity check matrix is m, $CS_{max}$ may be determined to be m/2. In other embodiments, $CS_{max}$ may be determined to be m.

The CS estimator 832 may determine a set of parameters θs using Equation (1) and may provide a set of read threshold voltages that minimizes $\widehat{CS}$. One of the read threshold voltages in the provided set may serve as the next suggested (or potential) read threshold voltage. For this, from Equation (1), the CS estimator 832 may derive Equation (2) below:

$$\theta_0 + \theta_1 v_2 + \theta_2 v_2^2 + \theta_3 v_6 + \theta_4 v_6^2 = S^{-1}\left(\frac{\widehat{CS}}{CS_{max}}\right) \quad (2)$$

Next, the CS estimator 832 may perform polynomial regression on Equation (2) to obtain the set of parameters $\Theta s = \{\theta_0, \theta_1, \ldots, \theta_4\}$.

Finally, the CS estimator 832 may compute a set of read threshold voltages, one of which may be used as the next suggested (or potential) read threshold voltage based on the set of parameters, as shown in Equation (3) below:

$$V_{cs}^{(n)} = \arg\min_{(v_2, v_6)} \widehat{CS} = \left(-\frac{\theta_1}{2 \cdot \theta_2}, -\frac{\theta_3}{2 \cdot \theta_4}\right) \quad (3)$$

As described above, in order to optimize (e.g., minimize) $\widehat{CS}$, the CS estimator 832 may make the partial derivative of $\widehat{CS}$ with respect to $v_2$ and $v_6$ equal to 0, and then find the result.

The P1 estimator 834 may estimate the percentage of 1's in data associated with a next potential read threshold voltage to be used for a next read operation, using a mathematical model (i.e., a linear model) as shown in Equation (4) below:

$$\widehat{P_1} = S(\phi_0 + \phi_1 v_2 + \phi_2 v_6) \quad (4)$$

The P1 estimator 834 may find a set of parameters ϕs using Equation (4) and may provide a set of read threshold voltages that maps the best previous read voltage as a set on a line of a surface (e.g., a surface of coordinates) formed by the previous read threshold voltages, each of which is a potential read threshold voltage for the next read operation. For this operation, from Equation (4), the P1 estimator 834 may derive Equation (5) below:

$$\phi_0 + \phi_1 v_2 + \phi_2 v_6 = S^{-1} \widehat{P_1} \quad ) \quad (5)$$

Next, the P1 estimator 834 may perform linear regression on Equation (5) to obtain the set of parameters $\Phi s = \{\phi_0, \phi_1, \phi_2\}$.

Then, the P1 estimator 834 may find the index of the best previous read through Equation $$k^* = \arg\min_{1 \leq k \leq m} cs^{(k)}.$$

Finally, the P1 estimator 834 may compute the next suggested (or potential) read threshold voltage based on the set of parameters, as shown in Equation (6) below:

$$V_{p_1}^{(n)} = \text{Project point}(v_2^{(k^*)}, v_6^{(k^*)}) \text{ on line } (\phi_0 + \phi_1 v_2 + \phi_2 v_6 = 0) \quad (6)$$

In Equation (6), "line" means a line in a 2-dimensional space of $(v_2, v_6)$.

In the read process, the target is for P1 to be as close as possible to 0.5. Therefore, the P1 estimator 834 may select the threshold voltage that gives $\widehat{P_1} = 0.5$. From the equation (4) above, $\widehat{P_1} = 0.5$ and $\phi_0 + \phi_1 v_2 + \phi_2 v_6 = 0$ may be derived. In other words, the P1 estimator 834 may indicate that any point on line $(\phi_0 + \phi_1 v_2 + \phi_2 v_6 = 0)$ has approximately the same number of ones and zeros (P1=50%).

The P1 estimator 834 may select only one point as the next suggested (or potential) read threshold voltage among those provided by P1. In other words, the P1 estimator 834 may find the point on the line $(\phi_0 + \phi_1 v_2 + \phi_2 v_6 = 0)$ as the best previous read threshold voltage. For example, the best previous read threshold voltage may be the one with the lowest checksum as shown in Equation (6) by $(v_2^{k^*}, v_6^{k^*})$. To find the point on the line $(\phi_0 + \phi_1 v_2 + \phi_2 v_6 = 0)$ as the best previous read threshold voltage point $(v_2^{k^*}, v_6^{k^*})$, another line can be drawn from the point $(v_2^{k^*}, v_6^{k^*})$, which is perpendicular to the line $(\phi_0 + \phi_1 v_2 + \phi_2 v_6 = 0)$. The P1 estimator 834 may find the intersection of these two lines as the next suggested (or potential) read threshold voltage. This operation may be called a projecting point operation in which point $(v_2^{k^*}, v_6^{k^*})$ is projected onto the line $(\phi_0 + \phi_1 v_2 + \phi_2 v_6 = 0)$.

The suggested (or potential) read threshold voltages $V_{cs}^{(n)}, V_{p_1}^{(n)}$ for a next potential read threshold voltage by the estimators 832, 834 may depend on how much data are available in the previous reads. Depending on the previous read data, both or one of the suggested (or potential) read threshold voltages $V_{cs}^{(n)}, V_{p_1}^{(n)}$ might be out of an acceptable threshold range $R_v$. In some embodiments, the acceptable threshold range $R_v$ for the read threshold voltage $(v_2)$ to read an LSB page of TLC memory cells may be obtained from the read retry table as $R_v = (R_{v2}^{min}, R_{v2}^{max})$, and the acceptable threshold range $R_v$ for the read threshold voltage $(v_6)$ to read the LSB page of TLC memory cells may be obtained from the read retry table as $R_v = (R_{v6}^{min}, R_{v6}^{max})$. Herein, $R_{v2}^{min}$ represents the minimum of all $v_2$ thresholds in the read retry table, $R_{v2}^{max}$ represents the maximum of all $v_2$ threshold in the read retry table, $R_{v6}^{min}$ represents the minimum of all $v_6$ thresholds in the read retry table and $R_{v6}^{max}$ represents the maximum of all $v_6$ threshold in the read retry table.

A bad estimation of potential read threshold voltages $V_{cs}^{(n)}, V_{p_1}^{(n)}$ might happen when all previous reads are very close to each other, and they do not contain sufficient information to identify the surface or when many previous reads suffer from excessive noise. The validity checker 836 may check whether at least one of the suggested (or potential) read threshold voltages $V_{cs}^{(n)}, V_{p_1}^{(n)}$ is out of the set of voltages having an acceptable threshold range $R_v$. The validity checker 836 may perform the check operation and a corresponding operation based on the check result, as shown in List (1):

List (1)

If($V_{cs}^{(n)} \in R_v$ and $V_{p_1}^{(n)} \in R_v$):

$$V^{(n)} = \frac{(V_{cs}^{(n)} + V_{p_1}^{(n)})}{2}$$

Else If($V_{cs}^{(n)} \in R_v$ and $V_{p_1}^{(n)} \notin R_v$):
  $V^{(n)} = V_{cs}^{(n)}$
Else If($V_{cs}^{(n)} \notin R_v$ and $V_{p_1}^{(n)} \in R_v$):
  $V^{(n)} = V_{p_1}^{(n)}$
Else: (Exploratory read module)
  Divide $R_v$ into multiple zones
  Find a zone $z_i^*$ with minimum number of previous reads
  $V^{(n)}$ is a random point in $z_i^*$ Referring to List 1, when the suggested (or potential) read threshold voltages $V_{cs}^{(n)}$, $V_{p_1}^{(n)}$ are not out of the acceptable threshold range $R_v$, the validity checker 836 may determine an average value of two read threshold voltages as the read threshold voltage for the next read operation. When one of the suggested (or potential) read threshold voltages $V_{cs}^{(n)}$, $V_{p_1}^{(n)}$ is within the acceptable threshold range $R_v$, the validity checker 836 may determine that the read threshold voltage within the set is acceptably within the threshold range $R_v$ and designate the determined read threshold voltage as the suggested (or potential) read threshold voltage for the next read operation. When both of the suggested (or potential) read threshold voltages $V_{cs}^{(n)}$, $V_{p_1}^{(n)}$ are outside the acceptable threshold range $R_v$, the validity checker 836 may control an exploratory read module to handle a scenario that both of the suggested (or potential) read threshold voltages are not reliable. The exploratory read module may divide the acceptable threshold range $R_v$ into multiple zones and find a zone $z_i^*$ with the lowest number of previous reads among the multiple zones. Then, the validity checker 836 may determine a random point in the zone $z_i^*$ as the suggested (or potential) read threshold voltage for the next read operation. An out of bounds check or another similar heuristic may be used for checking that the suggested (or potential) read threshold voltage is within the acceptable threshold range $R_v$.

In various embodiments, the validity checker 836 may divide the acceptable threshold range $R_v$ into 4 zones Zone1 to Zone4. For example, in the case of $R_v=(R_{v2}^{min}, R_{v2}^{max}, R_{v6}^{min}, R_{v6}^{max})$, each of the zones Zone1 to Zone4 may have the ranges as shown in List (2):

List (2)

$R_{v2}^{min} \leq v_2 < (R_{v2}^{min} + R_{v2}^{max})/2$, $R_{v6}^{min} \leq v_6 < (R_{v6}^{min} + R_{v6}^{max})/2$ ⟨Zone 1⟩

$\frac{R_{v2}^{min} + R_{v2}^{max}}{2} \leq v_2 \leq R_{v2}^{max}$, $R_{v6}^{min} \leq v_6 < (R_{v6}^{min} + R_{v6}^{max})/2$ ⟨Zone 2⟩

$R_{v2}^{min} \leq v_2 < (R_{v2}^{min} + R_{v2}^{max})/2$, $\frac{R_{v6}^{min} + R_{v6}^{max}}{2} \leq v_6 \leq R_{v6}^{max}$ ⟨Zone 3⟩

$\frac{R_{v2}^{min} + R_{v2}^{max}}{2} \leq v_2 \leq R_{v2}^{max}$, $\frac{R_{v6}^{min} + R_{v6}^{max}}{2} \leq v_6 \leq R_{v6}^{max}$ ⟨Zone 4⟩

Figure 11:
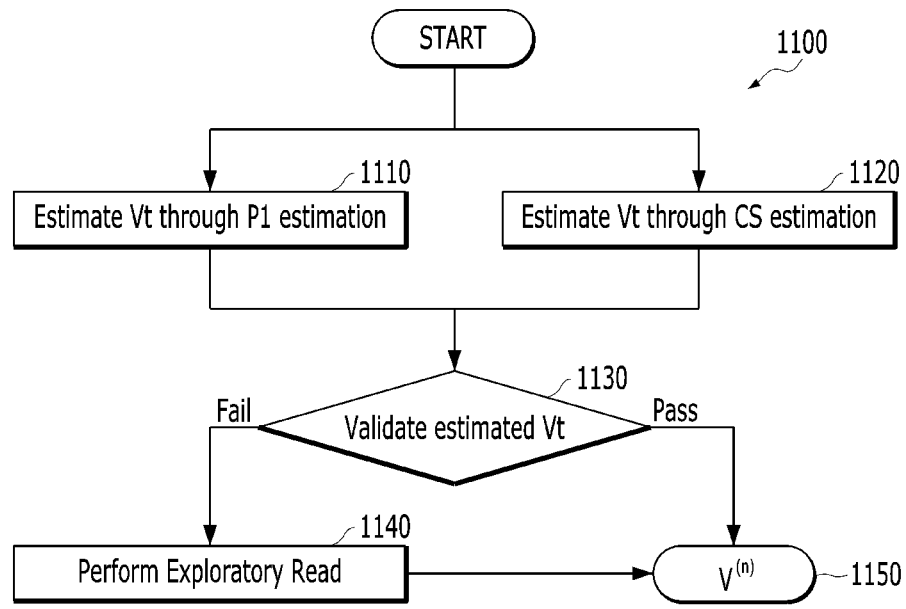
FIG. 11 is a flowchart illustrating an operation for determining a read retry threshold voltage in accordance with yet another embodiment of the present invention.

FIG. 11 is a flowchart illustrating an operation for determining a read retry threshold voltage in accordance with one embodiment of the present invention. The operation 1100 may be performed by firmware of the controller 100 including the read threshold determiner 830 in FIGS. 8 and 9.

Referring to FIG. 11, at operation 1110, the controller 100 may estimate a read threshold voltage Vt through P1 estimation. In some embodiments, the controller 100 may obtain meta information associated with read operations on a select page among the plurality of pages, as previously described. The controller 100 may determine a mathematical model for estimating the percentage of bits of a specific value, e.g., 1's, of data for a next read operation, by using a set function of the read threshold voltage set used for a current read operation. The controller 100 may determine a set of parameters by performing a linear regression on the utilized mathematical model. The controller 100 may determine a best previous read threshold voltage set among the multiple read threshold voltage sets, based on the multiple checksum values. The controller 100 may determine a point corresponding to the best previous read threshold voltage set on a surface, which is formed by each set among the multiple read threshold voltage sets. The controller 100 may determine a line of the surface based on the set of parameters. The controller 100 may estimate a next read threshold voltage for the next read operation by projecting the point on the line.

At operation 1120, the controller 100 may estimate a read threshold voltage Vt through CS estimation. In some embodiments, the controller 100 may obtain meta information associated with a read operation on a select page among the plurality of pages, as previously described by using for example previous read thresholds. The controller 100 may utilize a mathematical model (e.g., a quadratic model shown in Equation (1) or (7)) for estimating a checksum value for a next read operation, using a set function of the read threshold voltage set and a set checksum value. As used herein, a "set checksum value" refers to a checksum calculated on a set of values such as the set checksum value $CS_{max}$ shown in Equations (1) and (7). The controller 100 may determine a set of parameters by performing polynomial regression on the mathematical model. The controller 100 may estimate a next read threshold voltage for the next read operation based on the set of parameters.

At operation 1130, the controller 100 may determine whether estimated read threshold voltages at operations 1110, 1120 are valid. In some embodiments, the controller 100 may determine whether estimated next read threshold voltages are within an acceptable threshold range.

When it is determined that at least one of the estimated read threshold voltages is valid (Pass), the controller 100 may determine both or one of the estimated read threshold voltages as a new read threshold voltage $V^{(n)}$ for a next read operation.

When it is determined that both of the estimated read threshold voltages are invalid (Fail), at operation 1140, the controller 100 may perform an exploratory read to estimate a new read threshold voltage $V^{(n)}$ for a next read operation. In some embodiments, in order to perform an exploratory read, the controller 100 may divide the set threshold range into multiple zones when it is determined that both the first and second next read threshold voltages are not within the acceptable threshold range. The controller 100 may find a zone corresponding to the lowest number of read operations, among the multiple zones. The controller 100 may randomly determine, as the new read threshold voltage $V^{(n)}$, any read threshold voltage in the zone.

Methods described in U.S. patent application Ser. No. 17/348,391 are suitable for the present invention. For example, U.S. patent application Ser. No. 17/348,391 describes a suitable estimator for the present invention whereby an estimator for the LDPC checksum, which is the initial syndrome weight and provides a noisy estimate of the BER of the page is described.

In various embodiments of the present invention, to estimate the CS surface, two regions are considered: (1) the region close to the minimum value of the CS surface, which can be well approximated by a degree $d_{cs}$ polynomial, and (2) the region far from the optimal (or near optimal) read threshold, which is saturated to a maximum value of the checksum, denoted $CS_{max}$. Given these two regions, the following mathematical model can be used to estimate the checksum:

$$\hat{CS} = CS_{max} \times S(\theta_0 + \theta_1 v_2 + \ldots + \theta_{d_{cs}} v_2^{d_{cs}} + \theta_{d_{cs}+1} v_6 + \ldots + \theta_{2d_{cs}} v_6^{d_{cs}}) \quad (7)$$

Herein, S(•) denotes a set function such as for example a sigmoid function, and the checksum estimator $\hat{CS}$ ) is the product of the maximum (saturation) value of the checksum ($CS_{max}$) and a sum of N $d_{cs}$-degree polynomials corresponding to N read voltages of the plurality of read voltages. In this example, for the LSB page, N=2 corresponding to $v_2$ and $v_6$. Further, the set or sigmoid function may be a logistic function, a hyperbolic tangent function, an arctangent function, an error function, or a generalized logistic function.

One embodiment of the present invention utilizes $$invs_{CS} \triangleq S^{-1}\left(\frac{\hat{CS}}{CS_{max}}\right),$$

wherein $S^{-1}$ is the inverse sigmoid function that can be computed using arithmetic units or lookup tables (LUTs). Further, the precision of the LUTs and the inverse sigmoid function may be based on the available hardware or complexity constraints. Given this notation, Equation (7) above can be simplified to:

$$\theta_0 + \theta_1 v_2 + \ldots + \theta_{d_{cs}} v_2^{d_{cs}} + \theta_{d_{cs}+1} v_6 + \ldots + \theta_{2d_{cs}} v_6^{d_{cs}} = invs_{CS}. \quad (8)$$

Let ($v_2^{(i)}$, $v_6^{(i)}$) denote the i-th previous read, $CS^{(i)}$ denote the corresponding checksum, and m denote the number of previous reads. The information generated from the m previous reads can be used to construct matrices V and Y, which are defined as:

$$V = \begin{bmatrix} 1 & v_2^{(1)} & v_6^{(1)} & v_2^{(1)2} & v_6^{(1)2} & \ldots & v_2^{(1)d_{cs}} & v_6^{(1)d_{cs}} \\ 1 & v_2^{(2)} & v_6^{(2)} & v_2^{(2)2} & v_6^{(2)2} & \ldots & v_2^{(2)d_{cs}} & v_6^{(2)d_{cs}} \\ \vdots & \vdots & \vdots & \vdots & \vdots & \ddots & \vdots & \vdots \\ 1 & v_2^{(m)} & v_6^{(m)} & v_2^{(m)2} & v_6^{(m)2} & \ldots & v_2^{(m)d_{cs}} & v_6^{(m)d_{cs}} \end{bmatrix} \text{ and } Y = \begin{bmatrix} invs_{CS}^{(1)} \\ invs_{CS}^{(2)} \\ \vdots \\ invs_{CS}^{(m)} \end{bmatrix}$$

The number of previous reads can be selected such that $m \geq 2d_{cs}+1$, and the first parameter set $\Theta = [\theta_0, \theta_1, \ldots, \theta_{2d_{cs}}]$ for this first estimator can be determined using a linear least squares model, using:

$$\Theta = (V^T V)^{-1} \cdot V^T Y \quad (9)$$

U.S. patent application Ser. No. 17/348,391 further describes a suitable estimator for the present invention whereby an estimator for the ones count (denoted $P_1$), which is fraction of ones in a page that has a nominal value of 0.5 is described.

The following model is used to estimate probability of the ones count:

$$\hat{P}_1 = S(\phi_0 + \phi_1 v_2 + \ldots + \phi_{d_p} v_2^{d_p} + \phi_{d_p+1} v_6 + \ldots + \phi_{2d_p} v_6^{d_p}) \quad (10)$$

Herein, S(•) denotes the sigmoid function, and the ones count estimator $\hat{P}_1$ ) is the sum of N $d_p$-degree polynomials corresponding to N read voltages of the plurality of read voltages. In this example, for the LSB page, N=2 corresponding to $v_2$ and $v_6$. Further, the sigmoid function may be a logistic function, a hyperbolic tangent function, an arctangent function, an error function, or a generalized logistic function.

One embodiment of the present invention utilizes $invs_{p_1} \triangleq S^{-1} \hat{P}_1$ ), wherein $S^{-1}$ is the inverse sigmoid function that can be computed using arithmetic units or lookup tables (LUTs). Further, the precision of the LUTs and the inverse sigmoid function may be based on the available hardware or complexity constraints. Given this notation, Equation (10) above can be simplified to $$\phi_0 + \phi_1 v_2 + \ldots + \phi_{d_p} v_2^{d_p} + \phi_{d_p+1} v_6 + \ldots + \phi_{2d_p} v_6^{d_p} = invs_{p_1} \quad (11)$$

Let ($v_2^{(i)}$, $v_6^{(i)}$) denote the i-th previous read voltages, $P_1^{(i)}$ denote the corresponding percentage of ones, and m denote the number of previous reads. The information generated from the m previous reads can be used to construct matrices W and Z, which are defined as:

$$W = \begin{bmatrix} 1 & v_2^{(1)} & v_6^{(1)} & v_2^{(1)2} & v_6^{(1)2} & \ldots & v_2^{(1)d_p} & v_6^{(1)d_p} \\ 1 & v_2^{(2)} & v_6^{(2)} & v_2^{(2)2} & v_6^{(2)2} & \ldots & v_2^{(2)d_p} & v_6^{(2)d_p} \\ \vdots & \vdots & \vdots & \vdots & \vdots & \ddots & \vdots & \vdots \\ 1 & v_2^{(m)} & v_6^{(m)} & v_2^{(m)2} & v_6^{(m)2} & \ldots & v_2^{(m)d_p} & v_6^{(m)d_p} \end{bmatrix} \text{ and } Z = \begin{bmatrix} invs_{p_1}^{(1)} \\ invs_{CS}^{(2)} \\ \vdots \\ invs_{CS}^{(m)} \end{bmatrix}$$

The number of previous reads can be selected such that $m \geq 2d_p$, and the second parameter set $\Phi = [\phi_0, \phi_1, \ldots, \phi_{2d_p}]$ for this second estimator can be determined using a linear least squares model, using:

$$\Phi = (W^T W)^{-1} W^T Z \quad (12)$$

As described above, a read threshold voltage can be estimated for a new read operation using previous failed read information. Machine learning (ML) techniques such as deep neural networks are already used to make better and faster estimation of the read threshold voltage. However, in hardware ASIC's design, this performance improvement is obtained at cost of increasing both hardware area (e.g., silicon area) and estimation latency of read threshold voltage. Polynomial regression can be used as one of ML algorithms to reduce hardware complexity and latency. Polynomial regression models above may be generalized as following.

Let ($x_0^{(i)}$, $x_1^{(i)}$) denote i-th input variables and $y^{(i)}$ denote the corresponding output. Some programmed applications of the present invention can determine the relationship or model between an input matrix X associated with input variables and an output matrix Y associated with outputs thereof. This mathematical model can be used to predict (estimate) the output corresponding to future inputs. Often a simple linear relationship causes underfitting. To overcome underfitting, the complexity of the model can be increased. One potential model that can cover more complicated relationship between input and output is a polynomial regression model.

As described above, in NAND flash memory systems, previous failed read thresholds may be inputs and their corresponding checksum (CS) values or percentage of bits of a specific value in data (e.g., 1's) may be outputs, and polynomial regression in one embodiment of the present invention can be used to estimate the best values for the new read thresholds. Let m denote the number of input variables. Let n denote the degree of the polynomial regression model. Input and output matrices X, Y may be generated from m input and output variables, which are defined as:

$$X = \begin{bmatrix} 1 & x_0^{(1)} & x_1^{(1)} & x_0^{(1)2} & x_1^{(1)2} & \ldots & x_0^{(1)n} & x_1^{(1)n} \\ 1 & x_0^{(2)} & x_1^{(2)} & x_0^{(2)2} & x_1^{(2)2} & \ldots & x_0^{(2)n} & x_1^{(2)n} \\ \vdots & \vdots & \vdots & \vdots & \vdots & \ddots & \vdots & \vdots \\ 1 & x_0^{(m)} & x_1^{(m)} & x_0^{(m)2} & x_1^{(m)2} & \ldots & x_0^{(m)n} & x_1^{(m)n} \end{bmatrix} \text{ and } Y = \begin{bmatrix} y^{(1)} \\ y^{(2)} \\ \vdots \\ y^{(n)} \end{bmatrix}$$

Given m≥2n+1, the parameter set $\Theta=[\theta_0, \theta_1, \ldots, \theta_{2n}]$ is obtained using Equation (13):

$$\Theta=(X^T X)^{-1} \cdot X^T Y \qquad (13)$$

Equation (13) may be solved to compute the parameter set Θ using a set technique (e.g., Gauss-Jordan elimination technique). The following table Table (1) shows a number of mathematical operations such as addition (sum), multiplication (product) and division to solve Equation (9) using the Gauss-Jordan elimination technique. The number of mathematical operations can directly affect latency and area in hardware. Referring to Table (1), division and multiplication have much higher latency than addition (sum).

complexity and operation latency associated with polynomial regression method. In the illustrated example of FIG. 12, the polynomial regression module 1200 includes 4 components 1210 to 1240. The first component 1210 may provide a first scheme of using efficient ways to compute mathematical operation algorithms (i.e., "mult," "div" and "mult_div" algorithms) to reduce processing latency whenever it is possible. The "mult" algorithm (1212) represents an operation to improve (replace) a normal multiplication operation (a×b). The "div" algorithm (1214) represents an operation to improve a normal division operation (a/b). The "mult_div" algorithm (1216) represents an operation to improve a normal multiplication followed by division operation (a×b/c).

The second component 1220 may provide a second scheme of using a hybrid precision implementation to reduce storage and processing power for computing polynomial regression. The third component 1230 may provide a third scheme of eliminating some of complex operations using matrix symmetry. The fourth component 1240 may provide a fourth scheme of converting division operation needed for parameter normalization into shift operation.

In various embodiments, the polynomial regression module 1200 may use any one, two or more or all of the first to fourth schemes while performing a polynomial regression to estimate an optimal read threshold voltage. For this operation, the polynomial regression module 1200 may be implemented within the read threshold determiner 830 of the controller 100 as shown in FIG. 8.

Operations of the components 1210 to 1240 are described with reference to FIG. 13.

Figure 13:
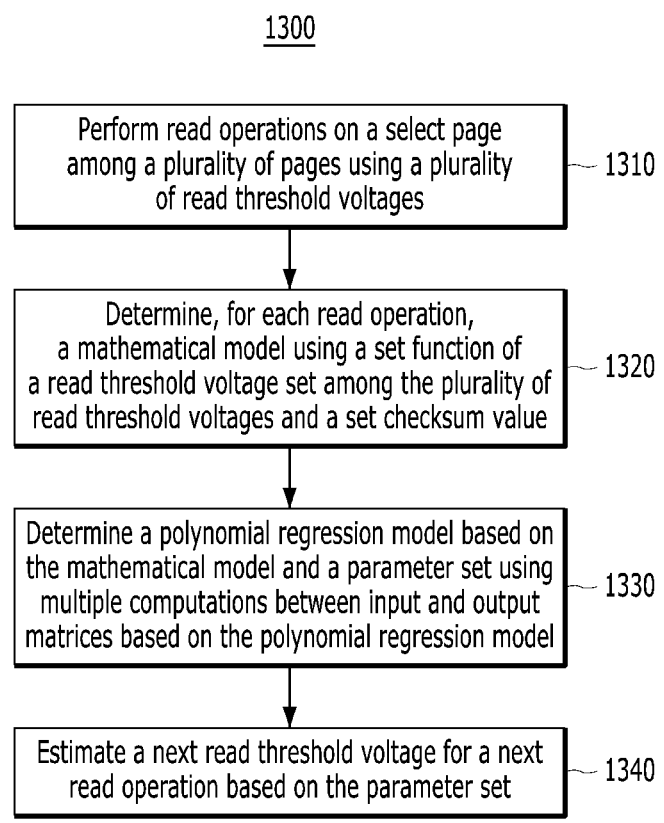
FIG. 13 is a flowchart illustrating an operation for determining a read retry threshold voltage based on polynomial regression in accordance with another embodiment of the present invention.

FIG. 13 is a flowchart illustrating an operation 1300 for determining a read retry threshold voltage based on polynomial regression in accordance with one embodiment of the present invention. In various embodiments, the operation

TABLE (1)

| Component | Computation | Number of operations | | |
|---|---|---|---|---|
| | | Product | Sum | Division |
| W | $X^T X$ | $m^2 \cdot n$ | $m^2 \cdot (n-1)$ | 0 |
| Z | $X^T Y$ | $m \cdot n$ | $m \cdot (n-1)$ | 0 |
| $W^{-1}$ | Forward Elimination | $\sum_{k=1}^{m}(i-1)^2 < m^3/5$ | $\sum_{k=1}^{m}(i-1)^2 < m^3/5$ | $\sum_{i=1}^{m}(i-1) < m^2$ |
| | Back Substitution | $\sum_{i=1}^{m}(i-1) \approx m^2$ | $\sum_{i=1}^{m}(i-1) \approx m^2$ | m |
| Θ | $W^{-1} \cdot Z$ | $m^2$ | $m \cdot (n-1)$ | 0 |

Embodiments of the present invention provide a scheme to reduce hardware complexity and operation latency required for performing the number of mathematical operations for a polynomial regression model. Embodiments of the present invention may be used for estimating a read threshold voltage using in particular failed read threshold voltages in a memory system (e.g., a system including NAND flash memory devices) through the polynomial regression model.

Figure 12:
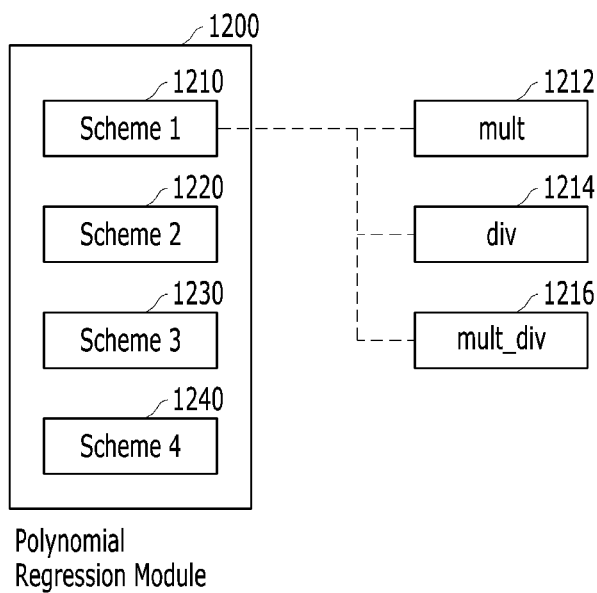
FIG. 12 illustrates a polynomial regression module in accordance with one embodiment of the present invention.

FIG. 12 illustrates a polynomial regression module 1200 in accordance with one embodiment of the present invention.

Referring to FIG. 12, the polynomial regression module 1200 may provide several schemes to reduce hardware 1300 may be performed by the controller 100 in FIG. 8, i.e., the read processor 810, the decoder 820 and the read threshold determiner 830. As noted above, the read threshold determiner 830 may include the polynomial regression module 1200 in FIG. 12.

Referring to FIG. 13, at operation 1310, the read processor 810 may perform read operations on a select page among a plurality of pages in the memory device 200 using a plurality of read threshold voltages.

At operation 1320, the polynomial regression module 1200 may determine, for each read operation, a mathematical model (e.g., Equations (1) and (7)) by using a set function S(•) of a read threshold voltage set (e.g., ($v_2$, $v_6$)) among the plurality of read threshold voltages and a set checksum value $CS_{max}$.

At operation 1330, the polynomial regression module 1200 may determine a polynomial regression model (e.g., Equations (2) and (8)) based on the mathematical model and a parameter set (e.g., Equation (9)) using multiple computations between input and output matrices based on the polynomial regression model.

At operation 1340, the polynomial regression module 1200 may estimate a next read threshold voltage for a next read operation based on the parameter set (e.g., Equation (3)).

In various embodiments, the input matrix includes entries of read threshold voltage sets for the read operations and the output matrix includes entries of check sum values for the read operations. For example, the input and output matrices may be matrices X and Y, respectively, which are described in paragraph [00142].

In various embodiments, the multiple computations between the input and output matrices may correspond to a product between a first component and a second component, which are shown in Table (1). In Table (1), the first component may be $W^{-1}$, i.e., the inverse of a third component W. The second component may be Z, i.e., a product between the transpose of the input matrix $X^T$ and the output matrix Y. The third component W may be a product between the transpose of the input matrix $X^T$ and the input matrix X.

In various embodiments, each component may be calculated by a mathematical operation on two or more numbers (e.g., (a, b) or (a, b, c)) as entries selected from one or more among the input and output matrices, which is shown in Table (1). With reference to Table (1), for the third component W, two numbers may be associated with a value of one entry of the transpose of the input matrix $X^T$ and a value of one entry the input matrix X. For the second component Z, two numbers may be associated with a value of one entry of the transpose of the input matrix $X^T$ and a value of one entry the output matrix Y. For the first component $W^{-1}$, two numbers may be associated with a value of one entry of the transpose of the input matrix $X^T$ and a value of one entry the input matrix X. For the component Θ, three numbers may be associated with two numbers for the second component Z and a number for the first component $W^{-1}$. In one embodiment, the mathematical operation may include "mult" operation (a×b), "div" operation (a/b), and/or "mult_div" operation (a×b/c). In another embodiment, each number has a set number of bit widths. For example, each number has 32 bits and is an integer greater than 0 (i.e., a>0, b>0, c>0).

In various embodiments, the mathematical operation may be performed by the first component 1210 of FIG. 12. The mathematical operation may include normalizing and scaling down the two or more numbers as shown in List (3) to List (5).

Referring back to FIG. 12, the first component 1210 may perform the "mult" algorithm (1212) as an operation to improve a normal multiplication operation (a×b). In various embodiments, the "mult" algorithm (1212) may be performed according to a sequence as shown in List (3):

---
List (3)
---

(310) Compute number of leading zeros for numbers a & b, denoted by $s_a$ & $s_b$.
(320) Normalize numbers to occupy all 32 bits, which are called $\bar{a}$ & $\bar{b}$.
(330) Scale down $\bar{a}$ & $\bar{b}$ into 16-bits versions.
(340) Multiply the scaled down versions to obtain the int32 product.

---

Referring to List (3), at 310, the first component 1210 may compute the number of leading zeros for each of first and second numbers (a, b) to generate first and second computation numbers ($s_a$, $s_b$).

At 320, the first component 1210 may normalize the first and second numbers to generate third and fourth numbers $\bar{a}$ $\bar{b}$ ), respectively. Each of the first to fourth numbers may have a first number of bits (e.g., 32 bits).

At 330, the first component 1210 may scale down the third and fourth numbers to generate first and second scale down versions. Each of the first and second scale down versions may have a second number of bits (e.g., 16 bits) less than the first number of bits.

At 340, the first component 1210 may multiply the first and second scale down versions to generate an output value corresponding to multiplication on the first and second numbers (i.e., int32 product).

An example of the "mult" algorithm (1212) is described in List (4):

---
List (4)
---

Numbers
   a = 8
   b = 6
Leading zeros
   $s_a$ = 28
   $s_b$ = 29
Normalized numbers
   normalized_a = (8 << $s_a$) = 2147483648
   normalized_b = (6 << $s_b$) = 3221225472
Scale down to 16
   scaled_down_a = (normalized_a >> 16) = 32768
   scaled_down_b = (normalized_b >> 16) = 49152
Finding the number of shift (sign of res_shft identify whether to shift left or right)
   res = (scaled_down_a * scaled_down_b) = 1610612736
   res_shift = 32 − s1-s2 = −25
   abs_shift = 25
Final output
   mul (6 * 8) = (res >> abs_shift) = (1610612736 >> 25) = 48

---

The first component 1210 may perform "div" algorithm (1214) as an operation to improve a normal division operation (a/b). In various embodiments, the "div" algorithm (1214) may be performed according to a sequence as shown in List (5):

---
List (5)
---

(510) Compute number of leading zeros for numbers a & b, denoted by $s_a$ & $s_b$.
(520) Normalize a & b to occupy all 32 bits, called $\bar{a}$ & $\bar{b}$.
(530) Scale down $\bar{b}$ into 16-bits version, and denote it by t.
If t=0, set t=1.
(540) Set res_shift = $s_b$ − $s_a$ − 15, abs_shift = abs(res_shift) & shift_dir = (res_shift >> 31) − 1.
(550) Compute res = $\bar{a}$ /t.
(560) res = ((res >> abs_shift) & (~shift_dir)) + ((res << abs_shift) & (shift_dir))
(570) a/b = res * (abs_shift < 32) * sign

---

Referring to List (5), at 510, the first component 1210 may compute the number of leading zeroes for each of first and second numbers (a, b) to generate first and second computation numbers ($s_a$, $s_b$).

At 520, the first component 1210 may normalize the first and second numbers to generate third and fourth numbers $\bar{a}$ $\bar{b}$ ), respectively. Each of the first to fourth numbers may have a first number of bits (e.g., 32 bits).

At 530, the first component 1210 may scale down the fourth number $\overleftarrow{b}$ ) to generate a scale down version having a second number of bits (e.g., 16 bits) less than the first number of bits. The scale down version may be denoted by (t). In some embodiments, if t is zero (0), the first component 1210 may set t to 1.

At 540, the first component 1210 may determine (set) first, second and third values (res_shift, abs_shift, shift_dir). The first value (res_shift) may be determined based on a difference between the first computation number ($s_a$) and the second computation number ($s_b$). For example, the first component 1210 may set the first value (res_shift) by: $\{S_b-s_a-15\}$. The second value (abs_shift) may be determined as an absolute value of the first value (res_shift), i.e., abs(res_shift). The third value (shift_dir) may be determined based on a shift of the first value (res_shift). For example, the first component 1210 may set the third value (shift_dir) by: {(res_shift>>31)−1}. Herein, (res_shift>>31) represents a shift to right variable (res_shift) by 31 bits.

At 550, the first component 1210 may determine (compute) a fourth value (res) based on division of the third number $\hat{a}$ ) by the scale down version (t).

At 560, the first component 1210 may determine a fifth value (res) by updating the fourth value (res) at 550. That is, the fifth value (res) is determined based on a bitwise operation between shifts of the fourth value (res) and the third value (shift_dir). In one embodiment, the fifth value (res) is determined by: res=((res>>abs_shift) & (~shift_dir))+((res<<abs_shift) & (shift_dir)). Herein, ((res>> abs_shift) represents a shift to right the fourth value (res) by abs_shift number of bits. ((res<<abs_shift) represents a shift to left the fourth value (res) by abs_shift number of bits. The operator "&" represents a logical bit-wise AND operation. The operator "~" represents a logical bit-wise NOT operation.

At 570, the first component 1210 may determine a sixth value (a/b) based on multiplication of the fifth value (res) and the second value (abs_shift). In one embodiment, the sixth value may be determined by: res*(abs_shift<<32) *sign. (abs_shift<<32) represents a shift to right abs_shift by 32 bits. The sixth value may a final value corresponding to division of the first number (a) by the second number (b).

An example of the "div" algorithm (1214) is described in List (6):

---
List (6)
---
Numbers
   a = 18
   b = 6
Leading zeros
   $s_a$ = 27
   $s_b$ = 29
Normalized numbers
   normalized_a = (18 << $s_a$) = 2415919104
   normalized_b = (6 << $s_b$) = 3221225472
Scale down to 16
   scaled_down_b = (normalized_b >> 16) = 49152
Finding the number of shift (sign of res_shft identify whether to shift left or right)
   res = normalized_a / scaled_down_b = 49152
   res_shift = ($s_b$ − $s_a$ − 16) = 29−27−16 = −14
   abs_shift = 14
Final output
   mul (18/6) = (res >> abs_shift) = (49152 >> 14) = 3

---

The first component 1210 may perform "mult_div" algorithm (1216) represents an operation to improve a normal multiplication followed by division operation (a×b/c). In various embodiments, the "mult_div" algorithm (1216) may be performed according to a sequence as shown in List (7).

---
List (7)
---
(710) Compute number of leading zeros for every number a, b & c, denoted by $s_a$ & $s_b$ & $s_c$.
(720) Normalize a & b & c to occupy all 32 bits, called $\hat{a}$ & $\hat{b}$ & $\hat{c}$ .
(730) Scale down $\hat{c}$ into 16-bits version, and denote it by t. If t=0, set t=1.
(740) Set res_shift = $s_c$ − $s_b$ − $s_a$ + 20, abs_shift = abs(res_shift) & shift_dir = (res_shift >> 31) − 1.
(750) Compute res = ($\hat{a}$ >> 18) = (b >> 18)/t.
(760) res = ((res >> abs_shift) & (~shift_dir)) + ((res << abs_shift) & (shift_dir))
(770) a x b / c = res * (abs_shift < 32) * sign

---

Referring to List (7), at 710, the first component 1210 may compute the number of leading zeroes for each of first, second and third numbers (a, b & c) to generate first, second and third computation numbers ($s_a$ & $s_b$ & $s_c$).

At 720, the first component 1210 may normalize the first to third numbers to generate fourth to sixth numbers $\hat{a}$ , $\hat{b}$ , $\hat{c}$ ), respectively. Each of the first to sixth numbers having a first number of bits (e.g., 32 bits).

At 730, the first component 1210 may scale down the sixth number $\overleftarrow{c}$ ) to generate a scale down version having a second number of bits (e.g., 16 bits) less than the first number of bits. The scale down version may be denoted by (t). In some embodiments, if t is zero (0), the first component 1210 may set t to 1.

At 740, the first component 1210 may determine (set) first, second and third values (res_shift, abs_shift, shift_dir). The first value (res_shift) may be determined based on a difference of the first to third computation numbers ($s_a$, $s_b$, $s_c$). For example, the first component 1210 may set the first value (res_shift) by: $\{s_c-s_b-s_a+20\}$. The second value (abs_shift) may be determined as an absolute value of the first value (res_shift), i.e., abs(res_shift). The third value (shift_dir) may be determined based on a shift of the first value (res_shift). For example, the first component 1210 may set the third value (shift_dir) by: {(res_shift>>31)−1}. Herein, (res_shift>>31) represents a shift to right variable (res_shift) by 31 bits.

At 750, the first component 1210 may determine (compute) a fourth value (res) based on multiplication of the fourth number $\hat{a}$ ) and the fifth number $\overleftarrow{b}$ ) which is followed by division of the scale down version (t).

At 760, the first component 1210 may determine a fifth value (res) by updating the fourth value (res) at 750. That is, the fifth value (res) is determined based on a bitwise operation between shifts of the fourth value (res) and the third value (shift_dir). In one embodiment, the fifth value (res) is determined by: res=((res>>abs_shift) & (~shift_dir))+((res<<abs_shift) & (shift_dir)). Herein, ((res>> abs_shift) represents a shift to right the fourth value (res) by abs_shift number of bits. ((res<<abs_shift) represents a shift to left the fourth value (res) by abs_shift number of bits. The operator "&" represents a logical bit-wise AND operation. The operator "~" represents a logical bit-wise NOT operation.

At 770, the first component 1210 may determine a sixth value (a×b/c) based on multiplication of the fifth value (res) and the second value (abs_shift). In one embodiment, the sixth value may be determined by: res*(abs_shift<<32)

*sign. (abs_shift<<32) represents a shift to right abs_shift by 32 bits. The sixth value may a final value corresponding to multiplication of the first number (a) by the second number (b) which is followed by division of the third number (c).

As described above, the first component 1210 provides the first scheme of mathematical operation algorithms to replace normal multiplication, division and multiplication followed division operations. These algorithms may help to compute fixed point multiplication and division almost four times faster than normal operations.

Although efficient, the first scheme of mathematical operation algorithms may compute multiplication and division using fixed bit width (e.g., 32 bit-widths) for all of the operations. In some programmed applications of the invention, several rounds of multiplication are needed which could lead to losing precision if the fixed bit width is assigned all the time. For example, when computing $a^2*b^2$ using the first scheme, 3 scale down operations for $a^2$, $b^2$ and $a^2*b^2$ may be performed and thus could cause the final output with much lower precision. Thus, the second component 1220 may provide the second scheme of using hybrid precision implementation to reduce storage and processing power for computing polynomial regression.

In detail, as a better way to compute each mathematical expression, the second component 1220 may select a lowest bit width for the numbers a & b depending on their range. That is, the second component 1220 may select the lowest bit width for the numbers a & b among a range of bit widths.

In hardware, there are several bit-widths for representing integer value as following:
  a) 8-bit integer represents any number between $[-2^7, (2^7)-1]=[-128, 127]$, where ^ represent power operation;
  b) 16-bit integer represents any number between $[-2^{15}, (2^{15})-1]=[-32768, 32767]$; and
  c) 32-bit integer represents any number between $[-2^{31}, (2^{31})-1]$.

Rather than using a fixed bit-width (for example 32-bit integer), embodiments of the present disclosure may find the proper bit-width for each value. For example, if a=67, "a" can be accurately represented by 8-bit integer. However, if a=500, it cannot be represented by 8-bit integer, and embodiments of the present disclosure should at least use 16-bit integer to represent the value.

Then, the second component 1220 may increase the lowest bit width whenever it is needed. For example, if a range of the numbers a & b is small enough, the second component 1220 may assign 8-bits to them, and thus 16-bits may be sufficient for $a^2$ & $b^2$. Finally, $a^2 \times b^2$ could be computed using 32-bit multiplication without the need to lose precision in the scale down process.

Referring back to Table (1), since the matrix X and the transpose of the matrix $X^T$ are symmetric, almost half of the matrix can be obtained from the other half. So, it is only needed to obtain the diagonal and upper triangular portion of the matrix. Thus, the third component 1230 of FIG. 12 may provide the third scheme of eliminating some of complex operations using matrix symmetry. That is, the third component 1230 may perform an operation on a half of the matrix and an operation on the other half of the matrix may be obtained from the operation on the half of the matrix.

The fourth component 1240 may provide the fourth scheme of converting division or multiplication operation needed for parameter normalization into shift operation.

In machine learning (ML) based algorithms, normalizing the inputs and output could help improving the algorithm accuracy. However, it would be useful if normalization can be done with a minimum amount of hardware overhead. So, in order to reduce the complexity of the hardware, the fourth component 1240 may find the closest power of 2 value to maximum and minimum of data at each column of the matrix. Then the normalization may be done by a proper shifting the data rather than using division or multiplication.

As described above, embodiments provide a scheme capable of reducing hardware complexity and operation latency required for performing mathematical operations for a polynomial regression model. Embodiments can be used for estimating a read threshold voltage using failed read threshold voltages in a memory system (e.g., a system including NAND flash memory devices) through the polynomial regression model.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives of the disclosed embodiment. Furthermore, the disclosed embodiments may be combined to form additional embodiments.

What is claimed is:

1. A memory system comprising:
   a memory device including a plurality of pages; and
   a controller configured to:
   perform read operations on a select page among the plurality of pages using a plurality of read threshold voltages;
   determine, for each read operation, a mathematical model by using a) a set function of a read threshold voltage set among the plurality of read threshold voltages and b) a set checksum value;
   determine a polynomial regression model based on the mathematical model;
   determine a parameter set by using multiple computations between input and output matrices based on the polynomial regression model; and estimate a next read threshold voltage for a next read operation based on the parameter set,
   wherein the input matrix includes entries of read threshold voltage sets from the read operations and the output matrix includes entries of check sum values for the read operations,
   wherein the multiple computations correspond to a product between a first component and a second component, the first component being the inverse of a third component, the second component being a product between the transpose of the input matrix and the output matrix, the third component being a product between the transpose of the input matrix and the input matrix,
   wherein each component is calculated by a mathematical operation on two or more numbers as entries selected from one or more among the input and output matrices, and
   wherein the mathematical operation includes normalizing and scaling down the two or more numbers for multiplication, division, and multiplication followed by division.

2. The memory system of claim 1, wherein the set function includes a sigmoid function,
   wherein the select page includes a least significant bit (LSB) page of a triple-level cell (TLC), and wherein the set checksum value is determined based on the number of rows of a parity check matrix used for decoding data associated with each read operation.

3. The memory system of claim 2, wherein the mathematical model is expressed as:

$$\widehat{CS} = cs_{max} \times S(\theta_0 + \theta_1 v_2 + \theta_2 v_2^2 + \theta_3 v_6 + \theta_4 v_6^2),$$

where S(•) denotes a sigmoid function, $(v_2, v_6)$ represents the read threshold voltage set for a least significant bit LSB page, $\widehat{CS}$ represents the estimated checksum value for data associated with the next read operation, $cs_{max}$ represents the maximum set checksum value and $\Theta = \{\theta_0, \theta_1, \ldots, \theta_4\}$ represents the set of parameters for performing the next read operation.

4. The memory system of claim 3, wherein the controller determines the polynomial regression model using an inverse sigmoid function of the mathematical model according to the following equation:

$$\theta_0 + \theta_1 v_2 + \theta_2 v_2^2 + \theta_3 v_6 + \theta_4 v_6^2 = S^{-1}\left(\frac{CS}{cs_{max}}\right),$$

where CS is a checksum at each read threshold voltage in the read threshold voltage set, and
wherein the controller determines the parameter set by applying a linear squares model to a set of polynomials associated with the polynomial regression model.

5. The memory system of claim 1, wherein the mathematical operation includes:
normalizing first and second numbers among the two or more numbers to generate third and fourth numbers, respectively, each of the first to fourth numbers having a first number of bits;
scaling down the third and fourth numbers to generate first and second scale down versions having a second number of bits less than the first number of bits; and
multiplying the first and second scale down versions to generate an output value corresponding to multiplication on the first and second numbers.

6. The memory system of claim 1, wherein the mathematical operation includes:
computing a number of leading zeroes for each of first and second numbers among the two or more numbers to generate first and second computation numbers;
normalizing the first and second numbers to generate third and fourth numbers, respectively, each of the first to fourth numbers having a first number of bits;
scaling down the fourth number to generate a scale down version having a second number of bits less than the first number of bits;
determining first, second and third values, wherein the first value is determined based on a difference between the first computation number and the second computation number, the second value is determined based on an absolute value of the first value, and the third value is determined based on a shift of the first value;
determining a fourth value based on division of the third number by the scale down version;
determining a fifth value based on a bitwise operation between shifts of the fourth value and the third value; and
determining a sixth value based on multiplication of the fifth value and the second value, the sixth value corresponding to division of the first number by the second number.

7. The memory system of claim 1, wherein the mathematical operation includes:
computing a number of leading zeroes for each of first, second and third numbers among the two or more numbers to generate first, second and third computation numbers;
normalizing the first to third numbers to generate fourth to sixth numbers, respectively, each of the first to sixth numbers having a first number of bits;
scaling down the sixth number to generate a scale down version having a second number of bits less than the first number of bits;
determining first, second and third values, wherein the first value is determined based on a difference of the first to third computation numbers, the second value is determined based on an absolute value of the first value, and the third value is determined based on a shift of the first value;
determining a fourth value based on multiplication the fourth number and the fifth number which is followed by division of the scale down version;
determining a fifth value based on a bitwise operation between shifts of the fourth value and the third value; and
determining a sixth value based on multiplication of the fifth value and the second value, the sixth value corresponding to multiplication of the first number by the second number which is followed by division of the third number.

8. The memory system of claim 1, wherein each number has a lowest bit width among a range of bit widths.

9. The memory system of claim 1, wherein the transpose of the input matrix and the input matrix are symmetric, and
wherein the third component performs operations on a half and the other half of the input matrix, and the other half of the input matrix is obtained from an operation on the half of the input matrix.

10. The memory system of claim 5, wherein the normalizing the first and second numbers includes:
finding a closest power of 2 to a maximum and a minimum of data at each column of each input and output matrix; and
shifting the data.

11. A method for operating a memory system including a memory device including a plurality of pages and a controller, the method comprising:
performing read operations on a select page among the plurality of pages using a plurality of read threshold voltages;
determining, for each read operation, a mathematical model by using a) a set function of a read threshold voltage set among the plurality of read threshold voltages and b) a set checksum value;
determining a polynomial regression model based on the mathematical model;
determining a parameter set by using multiple computations between input and output matrices based on the polynomial regression model; and
estimating a next read threshold voltage for a next read operation based on the parameter set,
wherein the input matrix includes entries of read threshold voltage sets from the read operations and the output matrix includes entries of check sum values for the read operations,
wherein the multiple computations correspond to a product between a first component and a second component, the first component being the inverse of a third component, the second component being a product between the transpose of the input matrix and the output matrix, the third component being a product between the transpose of the input matrix and the input matrix, wherein each component is calculated by a mathematical operation on two or more numbers as entries selected from one or more among the input and output matrices, and wherein the mathematical operation includes normalizing and scaling down the two or more numbers for multiplication, division, and multiplication followed by division.

12. The method of claim 11, wherein the set function includes a sigmoid function, wherein the select page includes a least significant bit (LSB) page of a triple-level cell (TLC), and wherein the set checksum value is determined based on the number of rows of a parity check matrix used for decoding data associated with each read operation.

13. The method of claim 12, wherein the mathematical model is expressed as:

$$\widehat{CS} = cs_{max} \times S(\theta_0 + \theta_1 v_2 + \theta_2 v_2^2 + \theta_3 v_6 + \theta_4 v_6^2),$$

where $S(\cdot)$ denotes a sigmoid function, $(v_2, v_6)$ represents the read threshold voltage set for a least significant bit LSB page, $\widehat{CS}$ represents the estimated checksum value for data associated with the next read operation, $cs_{max}$ represents the maximum set checksum value and $\Theta = \{\theta_0, \theta_1, \ldots, \theta_4\}$ represents the set of parameters for performing the next read operation.

14. The method of claim 13, wherein the polynomial regression model is determined using an inverse sigmoid function of the mathematical model according to the following equation:

$$\theta_0 + \theta_1 v_2 + \theta_2 v_2^2 + \theta_3 v_6 + \theta_4 v_6^2 = S^{-1}\left(\frac{CS}{cs_{max}}\right),$$

where CS is a checksum at each read threshold voltage in the read threshold voltage set, and wherein the parameter set is determined by applying a linear squares model to a set of polynomials associated with the polynomial regression model.

15. The method of claim 11, wherein the mathematical operation includes:

normalizing first and second numbers among the two or more numbers to generate third and fourth numbers, respectively, each of the first to fourth numbers having a first number of bits;

scaling down the third and fourth numbers to generate first and second scale down versions having a second number of bits less than the first number of bits; and multiplying the first and second scale down versions to generate an output value corresponding to multiplication on the first and second numbers.

16. The method of claim 11, wherein the mathematical operation includes:

computing a number of leading zeroes for each of first and second numbers among the two or more numbers to generate first and second computation numbers;

normalizing the first and second numbers to generate third and fourth numbers, respectively, each of the first to fourth numbers having a first number of bits;

scaling down the fourth number to generate a scale down version having a second number of bits less than the first number of bits;

determining first, second and third values, wherein the first value is determined based on a difference between the first computation number and the second computation number, the second value is determined based on an absolute value of the first value, and the third value is determined based on a shift of the first value;

determining a fourth value based on division of the third number by the scale down version;

determining a fifth value based on a bitwise operation between shifts of the fourth value and the third value; and determining a sixth value based on multiplication of the fifth value and the second value, the sixth value corresponding to division of the first number by the second number.

17. The method of claim 11, wherein the mathematical operation includes:

computing a number of leading zeroes for each of first, second and third numbers among the two or more numbers to generate first, second and third computation numbers;

normalizing the first to third numbers to generate fourth to sixth numbers, respectively, each of the first to sixth numbers having a first number of bits;

scaling down the sixth number to generate a scale down version having a second number of bits less than the first number of bits;

determining first, second and third values, wherein the first value is determined based on a difference of the first to third computation numbers, the second value is determined based on an absolute value of the first value, and the third value is determined based on a shift of the first value;

determining a fourth value based on multiplication the fourth number and the fifth number which is followed by division of the scale down version;

determining a fifth value based on a bitwise operation between shifts of the fourth value and the third value; and determining a sixth value based on multiplication of the fifth value and the second value, the sixth value corresponding to multiplication of the first number by the second number which is followed by division of the third number.

18. The method of claim 11, wherein each number has a lowest bit width among a range of bit widths.

19. The method of claim 11, wherein the transpose of the input matrix and the input matrix are symmetric, and wherein the third component performs operations on a half and the other half of the input matrix, and the other half of the input matrix is obtained from an operation on the half of the input matrix.

20. The method of claim 15, wherein the normalizing the first and second numbers includes:

finding a closest power of 2 to a maximum and a minimum of data at each column of each input and output matrix; and shifting the data.

* * * * *